(12) United States Patent
Kimura

(10) Patent No.: US 6,791,614 B1
(45) Date of Patent: Sep. 14, 2004

(54) COLOR LINEAR IMAGE SENSOR DEVICE WITH SHUTTER FUNCTION FOR CHARGES IN PHOTODETECTORS AND METHOD OF MANUFACTURING THE SAME

(75) Inventor: Tetsuji Kimura, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/303,573

(22) Filed: May 3, 1999

(30) Foreign Application Priority Data

| May 8, 1998 | (JP) | ............................................ 10-126093 |
| Dec. 2, 1998 | (JP) | ............................................ 10-343277 |

(51) Int. Cl.[7] .......................... H04N 3/14; H04N 5/335; H04N 9/09; H01L 21/00; H01L 27/148; H01L 29/768

(52) U.S. Cl. ....................... 348/323; 348/265; 348/324; 438/60; 438/75; 257/229; 257/232

(58) Field of Search .................................. 257/215, 222, 257/225, 227, 229, 232, 233, 461, 234; 438/57, 60, 73, 75, 97, 514, 532, 527, 530, 518, 519, 522, 223, 227; 348/262, 265, 311, 322, 323, 324, 296, 513, 514, 494, 497; 358/482, 483, 505, 512, 513, 514, 474; 250/208.1

(56) References Cited

U.S. PATENT DOCUMENTS

| 5,262,661 A | * | 11/1993 | Kuroda et al. ............... 257/227 |
| 5,903,363 A | * | 5/1999 | Yaguchi et al. ............. 358/474 |
| 5,973,736 A | * | 10/1999 | Kawamoto et al. ......... 348/324 |
| 5,995,249 A | * | 11/1999 | Sato et al. ................... 358/514 |
| 6,002,497 A | * | 12/1999 | Hirama ........................ 358/514 |
| 6,046,069 A | * | 4/2000 | Ishikawa et al. .............. 438/60 |
| 6,136,629 A | * | 10/2000 | Sin .............................. 438/48 |
| 6,235,563 B1 | * | 5/2001 | Oka et al. .................... 438/166 |
| 6,473,125 B1 | * | 10/2002 | Kuno .......................... 348/296 |

FOREIGN PATENT DOCUMENTS

| JP | 5268410 | 10/1993 |
| JP | 9162381 | 6/1997 |
| JP | 11146129 | 5/1999 |

* cited by examiner

Primary Examiner—Wendy R. Garber
Assistant Examiner—Justin Misleh
(74) Attorney, Agent, or Firm—Young & Thompson

(57) ABSTRACT

A color linear image sensor device has a shutter function for selectively draining charges stored in a photodetector circuit. The color linear image sensor device includes first, second, and third linear image sensors having different sensitivities with respect to incident light and arranged successively in sensitivity decreasing order from the outermost, and a shutter gate and a shutter drain for adjusting an amount of exposure to the linear image sensor which has the highest sensitivity to incident light.

9 Claims, 21 Drawing Sheets tTGa = tTGb = tTGc, Vsiga > Vsigb > Vsigc

COLOR LINEAR IMAGE SENSOR DEVICE WITH SHUTTER FUNCTION FOR CHARGES IN PHOTODETECTORS AND METHOD OF MANUFACTURING THE SAME

BACKGROUND OF THE INVENTION

1. Field of the Invention

The present invention relates to a color linear image sensor device with a shutter function for charges generated by a photodetector, and a method of manufacturing such a color linear image sensor device.

2. Description of the Related Art

Color linear image sensors are semiconductor devices having a plurality of parallel CCD linear image sensors disposed on a semiconductor substrate and having a charge transfer function. CCD linear image sensors comprise arrays of photodetectors with color filters of different colors (e.g., three color filters of the colors GREEN, BLUE, RED) mounted thereon.

Color linear image sensors have functions of converting incident light into charges and of successively outputting the charges, and are being widely used as a vital device in color scanners and color copying machines.

In actual color scanners and color copying machines, the color linear image sensor is mechanically scanned in a direction (feed direction) perpendicular to the direction (main scanning direction) of the arrays of photodetectors of the color linear image sensor for generating color information of an image in given positions on a subject. Color information of the image in given positions on the subject is produced for each of the colors using line outputs 1, 2, 3, . . . .

FIG. 1 is a view showing an overall arrangement of a conventional color linear image sensor. The color linear image sensor shown in FIG. 1 has no charge control function (shutter function).

As shown in FIG. 1, the conventional color linear image sensor comprises photodetector circuits 1001a–1001c have R, G, B color filters (not shown) mounted thereon for photoelectrically converting received light into charges, charge read circuits 1002a–1002c for reading the charges generated and stored by the photodetector circuits 1001a–1001c, and charge transfer circuits 1003a–1003c for transferring the charges read by the charge read circuits 1002a–1002c.

The charge transfer circuits 1003a–1003c usually comprise CCD shift registers that are driven by two-phase drive clocks ø1, ø2. The two-phase drive clocks ø1, ø2 are supplied from pulse lines L1001a–L1001c, L1002a L1002c that are disposed closely to the charge transfer circuits 1003a–1003c. The charges transferred by the charge transfer circuits 1003a–1003c, which are actually formed by floating diffused regions, are outputted from output circuits 1004a–1004c each comprising a charge detector for converting charges into voltages and an analog circuit including a source follower, an inverter, etc.

FIG. 2 is a view showing a detailed structure of the conventional color linear image sensor shown in FIG. 1. In FIG. 2, a lower figure section is an enlarged view of an area X4 indicated by the dotted lines in an upper figure section.

In FIG. 2, the color linear image sensor comprises polycrystalline silicon electrodes 1014a, 1014b indicated by the dot-and-dash lines and dotted lines, device separating areas 1017 indicated by the thin dotted lines, contacts 1006, 1007, 1009 indicated as small squares, and aluminum interconnections 1005, 1008, 1010 indicated by the solid lines.

FIG. 3A is a timing chart representing a taiming of timing the conventional color linear image sensor shown in FIG. 1.

In FIG. 3A, charges from the photodetector circuits 1001a–1001c are stored while pulses øTGa, øTGb, øTGc are in low level (storage times tTGa, tTGb, tTGc), and read into the charge transfer circuits 1003a–1003c while the pulses øTGa, øTGb, øTGc are in high level. The outputs are line outputs, respectively, representing successions of outputs from all pixels ranging from the first pixel to the last pixel in the photodetector circuits 1001a–1001c. The storage times for the photodetector circuits 1001a–1001c are equal to each other (tTGa=tTGb=tTGc).

If average voltages of all the pixels of the respective line outputs, from a reference level (no incident light applied), are represented by Vsiga, Vsigb, Vsigc, then depending on the sensitivity of the photodetector circuits 1001a–1001c, the relation of these average voltages are represented as Vsiga>Vsigb>Vsigc.

FIG. 3B is a timing chart representing a timing of driving the conventional color linear image sensor shown in FIG. 1 by changing the storage times for charges with respect to the respective colors, rather than changing the amount of exposure according to the amount of incident light.

As shown in FIG. 3B, the storage times tTGa, tTGb, tTGc for the respective colors are adjusted to yield saturated amounts of exposure SEG, SER, SEB, providing the same saturated output voltages Vsiga, Vsigb, Vsigc.

Another conventional color linear image sensor is disclosed in U.S. Pat. No. 5,105,264. The disclosed color linear image sensor is shown in FIG. 4. In the disclosed color linear image sensor, each of photodetector circuits has a shutter function.

The color linear image sensor shown in FIG. 4 comprises shutter gates 1015a–1015c, shutter drains 1016a–1016c, photodetector circuits 1001a–1001c for photoelectrically converting received light into charges, charge read circuits 1002a–1002c for reading the stored charges, charge transfer circuits 1003a–1003c for transferring the charges read by the charge read circuits 1002a–1002c, and output circuits 1004a–1004c for outputting the charges transferred by the charge transfer circuits 1003a–1003c.

Two-phase drive clocks ø1, ø2 for driving the charge transfer circuits 1003a–1003c are supplied from pulse lines L1001a–L1001c, L1002a–L1002c that are disposed closely to the charge transfer circuits 1003a 1003c.

The shutter gates 1015a–1015c and the shutter drains 1016a–1016c are disposed on the opposite side of the photodetector circuits 1001a–1001c, which appropriately changes the pulse width supplied to the shutter gates 1015a–1015c while pulses øTGa, øTGb, øTGc applied to the charge read circuits 1002a–1002c are in low level, enabling a production of the appropriate amounts of exposure with respect to the three colors R, G, B.

The shutter gates 1015a–1015c and shutter drains 1016a–1016c are also provided in the conventional color linear image sensor shown in FIG.4.

FIG. 5 is a timing chart representing a timing of driving the conventional color linear image sensor is shown in FIG. 4.

As shown in FIG. 5, the storage times tTGa, tTGb, tTGc for the respective colors are equal to each other (tTGa=tTGb=tTGc), so that the line outputs from the respective three colors can be outputted in synchronism with each other. Even if the photodetector circuits 1001a–1001c have different sensitivity, adjustment of the width of pulses øSTa, øSTb, øSTc supplied to shutter gates 1015a–1015c affords the same voltage (Vsiga=Vsigb=Vsigc) for the respective three colors.

The same voltage can be produced for the respective three colors for the following reasons: Since pulses øTGa–øTGc applied to the charge read circuits 1002a–1002c are low level While pulses øSTa–øSTc supplied to the shutter gates 1015a–1015c are high level, and charges stored in the photodetector circuits 1001a–1001c are drained into the shutter drains 1016a–1016c, and hence are reduced charges in the photodetector circuits 1001a–1001c to zero level. When the pulses øSTa–øSTc supplied to the shutter gates 1015a–1015c then become low level, an accumulation of charges starts again.

The substantial charge storage times for the signal outputs of the colors R, G, B are thus represented by tSTa, tSTb, tSTc, respectively. Based on these storage times tSTa, tSTb, tSTc, it is possible to establish appropriate amounts of exposure for the signal outputs of the colors R, G, B, and to cause the same saturated output voltage for the three colors to be outputted with an arbitrary light source.

Generally, an output voltage of a color linear image sensor is proportional to an amount of exposure, i.e., the product of an amount of incident light applied to the photodetectors and a storage time.

However, the output voltage does not increase beyond a certain output voltage level even when the amount of exposure increases. Such an output voltage level is referred to as a saturated output voltage Vsat. The amount of exposure corresponding to the saturated output voltage is referred to as a saturated amount of exposure. The greater the saturated amount of exposure is, the wider the voltage amplitude adoptable as the saturated output voltage and the dynamic range, i.e., the ratio of the saturated output and noise, e.g., dark output. Image sensors are required to have a saturated output voltage Vsat as high as possible.

The saturated output voltage is normally determined by the maximum amounts of stored charges in the photodetector circuits, the maximum amounts of charges in the charge transfer circuits, or by the amplitudes of the signal outputs from the signal output circuits. Details of the saturated output voltage will be omitted as they have no direct bearing on the present invention.

It can be seen from FIG. 8 that GREEN reaches a saturated output voltage with least amount of exposure, i.e., GREEN has the highest sensitivity, and sensitivities RED and BLUE decrease in order of RED, BLUE, and that the amount of exposure for BLUE needs to be three times the amount of exposure for GREEN.

Since color filters (not shown) are mounted respectively on three color linear image sensors in case they have the aforementioned characteristics, the saturated output voltages of the respective color linear image sensors are the same as each other for the three colors R, G, B unless the sizes of the photodetectors and the charge transfer circuits are changed or the maximum voltage amplitudes of the output circuits are changed. Because the color linear image sensors should have as high a saturated output voltage as possible, the saturated output voltages for the three colors should preferably be equal to each other.

Color linear image sensors usually have different sensitivities (output signal voltages/amounts of exposure) for R, G, B output signals. Even if sensitivities for R, G, B output signals are equal to each other under a certain light source, they may not necessarily be equal to each other under a different light source. The relationship between the amount of exposure and output voltages of color linear image sensors are as shown in FIG. 8.

As is clear from FIG. 8, whereas the saturated output voltages Vsat for the R, G, B output signals are equal to each other, RED, BLUE output, other than an GREEN output whose sensitivity is the highest, can be used only up to respective levels VsatR, VsatB. If the color linear image sensor is used beyond its saturated amount of exposure SEG, i.e., the amount of exposure which produces the saturated output voltage VsatG for the GREEN output signal, the GREEN output signal will exceed the saturated output voltage thereof, and no proper image data will be generated for GREEN. A charge overflow from the photodetectors and the charge transfer circuit for GREEN may flow into the photodetectors and the charge transfer circuit for the other two colors, leading to a color mixture.

In the example shown in FIG. 8, GREEN has the highest substantial saturated output voltage and BLUE the lowest. Therefore, a difference in the dynamic range from color to color results in an adverse effect on the quality of images generated by the color linear image sensor. It may be possible to use the color linear image sensor such that different amounts of light for the respective colors are applied to the color linear image sensor to produce saturated output voltages for the respective colors. The use of the color linear image sensor in such a manner, however, leads to a complex driving of the light source and an increase in the cost of color scanners and color copying machines.

As described above, the overflowed charges flow into the photodetector circuits for the other colors and the charge transfer circuit, so that the conventional color image sensors are unsuitable for use in intended applications.

In color scanners and color copying machines provided with a color linear image sensor, the color linear image sensor is mechanically scanned in a direction (feed direction) perpendicular to the direction (main scanning direction) of the arrays of photodetectors of the color linear image sensor.

Therefore, in order to obtain color information of all the three colors of an image in an arbitrary position on a subject, a first line, e.g., GREEN, of the image is scanned, then a second line, e.g., BLUE, of the image is scanned, and finally a third line, e.g., RED, of the image is scanned. At this time, until after the third line is scanned, color information obtained when the first and second lines are scanned needs to be stored, and then signal processing needs to be performed on the color information for the three colors. Therefore, an external memory is required to store the color information of the first and second lines. For example, Assuming that the gray scale (gradations from white to black) is represented by 12 bits, a color linear image sensor of 5,300 pixels for use in a high-resolution color scanner or color copier requires an external memory whose storage capacity is represented by:

$$C=5300\times12\times3\times(M+1) \text{ bits} \quad (1)$$

where M represents the interlinear distance between two adjacent photodetector circuits, as the number of scanning cycles. The interlinear distance is produced when the absolute value of the distance between pixel columns of the color linear image sensor by the size of pixels.

For example, if R, G, B have a size of 8 $\mu$m×8 $\mu$m and the interlinear distance between photodetector circuits is 64 $\mu$m, M=64 $\mu$m/8 $\mu$m=8, the storage capacity of a required external memory is 1,717,200 bits.

As can be seen from the above equation (1), in order to reduce the storage capacity of an external memory, it is necessary to shorten the interlinear distances between three photodetector circuits and reduce the number of scanning cycles.

Extraordinarily large and narrow semiconductor chips for use as color linear image sensors, for example, a photodetector circuit has a length of 5300×8 μm=42.4 mm, and an overall length runs up to 45 to 50 mm including an output circuit and bonded regions.

Therefore, variations in the chip length increase or decrease contribute only to the formation of two or three patterns of color linear image sensors on a wafer. This scarcely affects the cost of the chip.

As can be seen from the above example of the extraordinarily long and narrow semiconductor chips, the width of the chip is the sum of the distance between photodetectors (twice the distance between lines), the width of the charge read circuits, the width of the charge transfer circuits, the width of the pulse lines, and the width of other peripheral regions, and is about 1.0 mm at most. Thus, the chip width is responsible for the chip cost. It is desirable to shorten the interlinear distance as it greatly affects the chip cost.

Major factors for determining the interlinear distance includes the size of one photodetector pixel, the size of the charge read circuits, the size of the charge transfer circuits, and the size of the device separating areas between the charge transfer circuits and the photodetector circuits adjacent thereto (including the size of the pulse lines).

In the conventional color linear image sensor shown in FIG. 2, for example, one pixel of the photodetector circuits 1001a–1001c has a size of 8 μm, the charge read circuits 1002a–1002c have a size of 10 μm, the charge transfer circuits 1003a–1003c have a size of 12 μm, and the device separating areas 1017 between the charge transfer circuits 1003a–1003c and the photodetector circuits 1001a–1001c adjacent thereto have a size of 32 μm.

With the size of 2 μm of connecting areas added to the above sizes, the overall interlinear distance is 64 μm (M=8).

Of the above factors, the size of one pixel of the photodetector circuits 1001a–1001c is unchangeable as it is predetermined. It is not easy to reduce the size of the charge read circuits 1002a–1002c from 10 μm because the charge read circuits 1002a–1002c require interconnections for supplying a clock signal to drive them and an area for connecting the polycrystalline silicon electrodes 1014a, 1014b where the charge read circuits 1002a–1002c are fabricated. The smaller the size of the charge transfer circuits 1003a–1003c is the smaller the maximum amount of charges that can be processed and the dynamic range of output signals are in corresponding thereto. Therefore, a careless reduction in the size of the charge transfer circuits 1003a–1003c results in characteristic degradations.

The charge transfer circuits 1003a–1003c and the device separating area 1017a between the photodetector circuits adjacent thereto need the considerable length of about 30 μm, As with the charge read circuits 1012a–1012c, the reduction in the device separating areas 1017 is not an easy task, because they are fabricated by connecting the aluminum interconnections 1005, 1008, 1010 which serve as the pulse lines in the device separating areas 1017 and one of the polycrystalline silicon electrodes 1014a, 1014b where the charge read circuits 1002a–1002c are fabricated with the contacts 1006, 1007, 1009, and by connecting the polycrystalline silicon electrodes 1014a, 1014b and the aluminum interconnections 1005, 1008, 1010 with the contacts 1006, 1007, 1009.

Accordingly, it is hard to change the sizes of the above areas. The interlinear distance shown in the conventional color linear image sensor shown in FIG. 2 is the least one at present.

Of the conventional arrangements described above, the conventional color linear image sensor shown in FIG. 2 does not any have shutter gates and shutter drains in the photodetectors.

In order to produce the same amount of saturated voltages in the three colors R, G, B, therefore, it is necessary to change the storage times for charges with respect to the respective times, as shown in FIG. 3B, rather than changing the amount of exposure depending on the amount of incident light. However, there have been disadvantages that the timing control for the signals is complex, and the line outputs for the lines 1, 2, 3 are out of phase with each other, so that subsequent signal processing is inevitable.

The conventional color linear image sensor disclosed in U.S. Pat. No. 5,105,264 has respective shutter gate and shutter drain at the photodetectors individually.

There has been a problem in the disclosed structure that the interlinear distance increases compared with that in the conventional color linear image sensor shown in FIG. 2. This problem becomes clear in comparing FIG. 1 with FIG.4, where the sizes of the added shutter gates and the added shutter drains become a factor in the determination of the interlinear distance.

To give an actual example, the shutter gates (including aluminum interconnections) require a size of about 10 μm and the shutter drains (including aluminum interconnections) require a size of about 10 μm. Therefore, the interlinear distance increases by about 20 μm. If one pixel has a size of 8 μm, M=84 μm/8 μm=10.5, resulting in an increase of 2–3 lines.

SUMMARY OF THE INVENTION

It is an object of the present invention to provide a color linear image sensor device with a shutter function, which retains substantially the same interlinear distance as that of conventional color linear image sensors without a shutter function, and which affords appropriate amounts of exposure for R, G, B.

An aspect of the present invention is to provide a method of manufacturing a color linear image sensor device with a shutter function.

According to one aspect of the present invention, there is provided a color linear image sensor device comprising first, second, and third linear image sensors having different sensitivities with respect to incident light and arranged successively in sensitivity decreasing order from the outermost, and a shutter gate and a shutter drain for adjusting an amount of exposure of the linear image sensor which has the highest sensitivity to incident light.

According to another aspect of the present invention, the color linear image sensor device further comprises means for changing the pulse interval of a first pulse applied to drain charges stored in the linear image sensor which has the highest sensitivity to incident light supplied to the shutter gate through the shutter gate to the shutter drain, thereby changing an output voltage from the linear image sensor which has the highest sensitivity to incident light.

The fabrication of the first, second, and third linear image sensors involves the steps of introducing a P-type impurity into an N-type semiconductor substrate with ion implantation and thermally diffusing the introduced P-type impurity at a high temperature to form a P-type well, introducing an N-type impurity into predetermined areas where the first, second, and third photodetector circuits are formed with ion implantation, and then thermally diffusing the introduced N-type impurity at a high temperature to form a first N-type region, introducing an N-type impurity into predetermined areas where the first, second, and third charge transfer circuits and the shutter drain are formed with ion implantation and then thermally diffusing the introduced N-type impurity at a high temperature to form second and third N-type regions, forming the shutter gate, the first, second, and third charge read circuits, and the first, second, and third charge transfer circuits in predetermined areas, using a thermally oxidized film as an insulating film, and finally introducing a P-type impurity with ion implantation with polycrystalline silicon electrodes used as masks to form a P-type region providing the first, second, and third photodetector circuits in self-alignment with the polycrystalline silicon electrodes.

According to another aspect of the present invention, there is provided a color linear image sensor device comprising first, second, and third linear image sensors for three colors having different sensitivities with respect to incident light and arranged in order of the linear image sensor whose sensitivity to incident light is the highest, the linear image sensor whose sensitivity to incident light is the lowest, and the linear image sensor whose sensitivity to incident light is middle from an outermost, a first shutter gate and a first shutter drain disposed at the linear image sensor whose sensitivity to incident light is the highest, for adjusting an amount of exposure to the linear image sensor, and a second shutter gate and a second shutter drain disposed at the linear image sensor whose sensitivity to incident light is middle, for adjusting an amount of exposure to the linear image sensor.

According to an aspect of the present invention, the linear image sensor whose sensitivity to incident light is the highest comprises a first photodetector circuit for converting the incident light into charges, a first charge read circuit for reading the charges generated by the first photodetector circuit, a first charge transfer circuit for transferring the charges read by the first charge read circuit in synchronism with first and second drive clocks, a first output circuit for converting the charges transferred by the first charge transfer circuit into a voltage, and outputting the voltage, and first and second pulse lines for supplying the first and second drive clocks to the first charge transfer circuit.

The linear image sensor whose sensitivity to incident light is the lowest and the linear image sensor whose sensitivity to incident light is the second highest comprise respective second and third photodetector circuits for converting the incident light into charges, respective second and third charge read circuits for reading the charges generated by the second and third photodetector circuits, a second charge transfer circuit for transferring the charges read by the second and third charge read circuits in synchronism with second and third drive clocks, a second output circuit for converting the charges transferred by the second charge transfer circuit into a voltage, and outputting the voltage, and a third pulse line for supplying the third drive clock to the second charge transfer circuit.

The second charge transfer circuit, the signal output circuit, and the first and third pulse lines are shared by the linear image sensor whose sensitivity to incident light is the lowest and the linear image sensor whose sensitivity to incident light is middle.

According to an aspect of the present invention, the above color linear image sensor device further comprises means for changing a pulse interval of a first pulse applied to drain charges stored in the linear image sensor which has the highest sensitivity to incident light and supplied to the first shutter gate, through the first shutter gate to the first shutter drain, and a pulse interval of a second pulse applied to drain charges stored in the linear image sensor which has middle sensitivity to incident light and supplied to the second shutter gate, through the second shutter gate to the second shutter drain, thereby changing output voltages from the first and third linear image sensors.

The fabrication of the first, second, and third linear image sensors of the above color linear image sensor device involves the steps of introducing a P-type impurity into an N-type semiconductor substrate with ion implantation and thermally diffusing the introduced P-type impurity at a high temperature to form a P-type well, introducing an N-type impurity into predetermined areas where the first, second, and third photodetector circuits are to be formed with ion implantation, and then thermally diffusing the introduced N-type impurity at a high temperature to form an N-type region, introducing an N-type impurity into predetermined areas where the first, second, and third charge transfer circuits and the shutter drains are to be formed, with ion implantation, and then thermally diffusing the introduced N-type impurity at a high temperature to form N-type regions, forming the shutter gates, the first, second, and third charge read circuits, and the charge transfer circuits in predetermined areas, using a thermally oxidized film as an insulating film, and introducing a P-type impurity with ion implantation with polycrystalline silicon electrodes used as masks to form a P-type region providing the first, second, and third photodetector circuits in self-alignment with the polycrystalline silicon electrodes.

The color linear image sensor devices according to the present invention have the same interlinear distance as that of color linear image sensors with no shutter function, and allow the amount of exposure to be adjusted for the linear image sensor whose sensitivity to incident light is the highest.

The above and other objects, features, and advantages of the present invention will become apparent from the following description with reference to the accompanying drawings which illustrate examples of the resent invention.

BRIEF DESCRIPTION OF THE DRAWINGS

FIGS. 21A, 24B, and 21C are timing charts showing a timing of driving the color linear image sensor device according to the second embodiment of the present invention.

DESCRIPTION OF THE PREFERRED EMBODIMENTS

Figure 6:
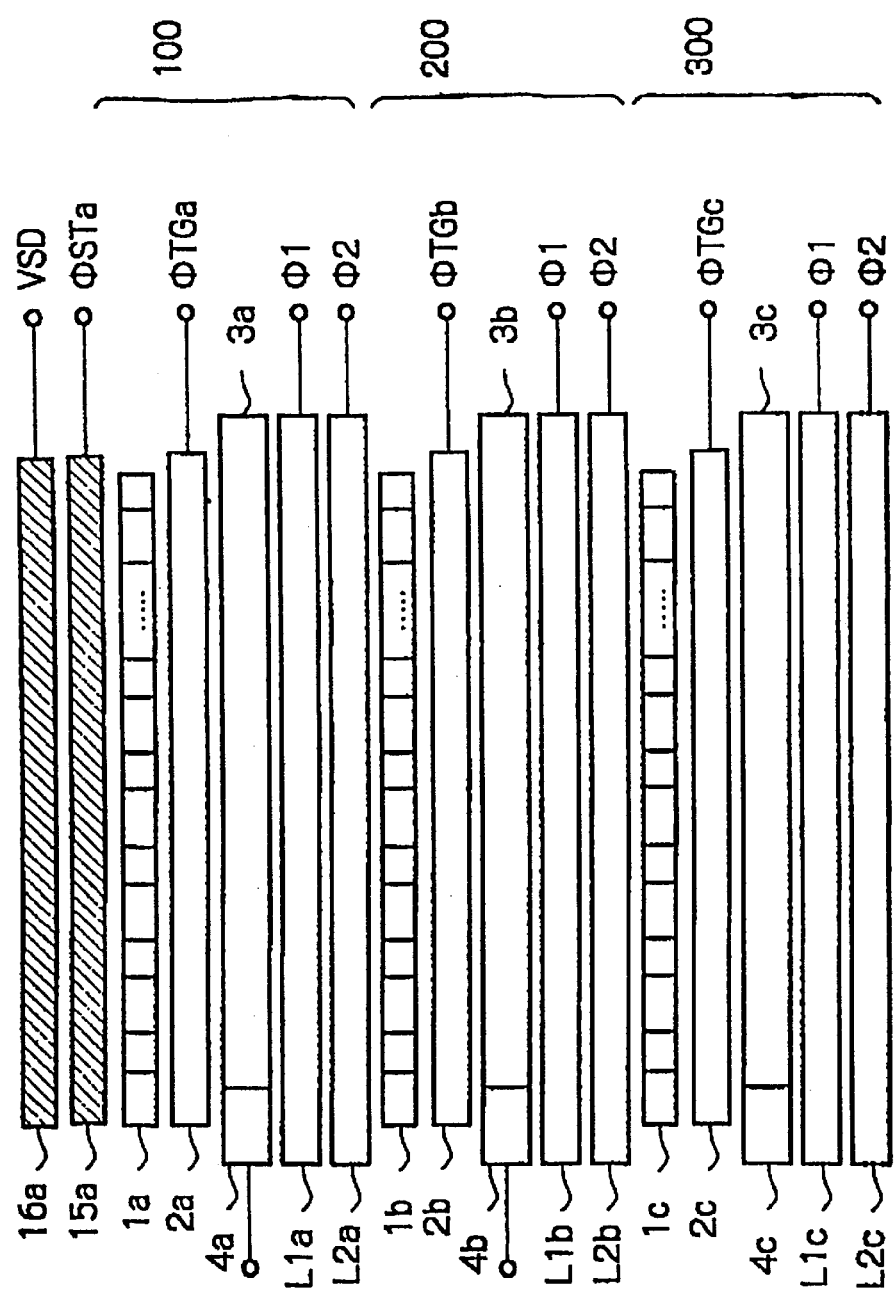
FIG. 6 is a view showing an overall arrangement of a color linear image sensor device according to a first embodiment of the present invention.

Referring to FIG. 6, a color linear image sensor device according to a first embodiment of the present invention comprises first, second, and third linear image sensors 100, 200, 300 having different sensitivities with respect to incident light and arranged successively in sensitivity decreasing order from the outermost one, and a shutter gate 15a and a shutter drain 16a for adjusting the amount of exposure of the color linear image sensor with the highest sensitivity.

The first, second, and third linear image sensors 100, 200, 300 are arranged such that the linear image sensor 100 with the highest sensitivity is disposed at the outermost linear image sensor. A shutter function is only given to a photodetector circuit 1a of the linear image sensor 100.

The first linear image sensor 100 comprises a first photodetector circuit 1a for converting light in GREEN into charges, a first charge read circuit 2a for reading the charges generated by the first photodetector circuit 1a, a first charge transfer circuit 3a for transferring the charges read by the first charge read circuit 2a in synchronism with drive clocks ø1, ø2, a first signal output circuit 4a for converting the charges transferred by the first charge transfer circuit 3a into a voltage and outputting the voltage, and first and second pulse lines L1a, L2a for supplying first and second drive clocks to the first charge transfer circuit 3a.

The second linear image sensor 200 comprises a second photodetector circuit 1b for converting light in RED into charges, a second charge read circuit 2b for reading the charges generated by the second photodetector circuit 1b, a second charge transfer circuit 3b for transferring the charges read by the second charge read circuit 2b in synchronism with first and second drive clocks ø1, ø2, a second signal output circuit 4b for converting the charges transferred by the second charge transfer circuit 3b into a voltage and outputting the voltage, and third and fourth pulse lines L1b, L2b for supplying third and fourth drive clocks to the second charge transfer circuit 3b.

The third linear image sensor 300 comprises a third photodetector circuit 1c for converting light in BLUE into charges, a third charge read circuit 2c for reading the charges generated by the third photodetector circuit 1c, a third charge transfer circuit 3c for transferring the charges read by the third charge read circuit 2c in synchronism with third and fourth drive clocks ø1, ø2, a third signal output circuit 4c for converting the charges transferred by the third charge transfer circuit 3c into a voltage and outputting the voltage, and fifth and sixth pulse lines L1c, L2c for supplying fifth and sixth drive clocks to the third charge transfer circuit 3c.

As shown in FIG. 6, the characteristics of the first embodiment are that the shutter gate 15a and the shutter drain 16a for adjusting the amount of exposure are disposed outside of the first photodetector circuits 1a of the first linear image sensor 100. Signal lines are connected to right-hand ends of the above components of the first, second, and third linear image sensors 100, 200, 300. The shutter drain 16a is supplied with a power supply energy VSD, the shutter gate 15a with pulses øSTa for storing charges, the first charge read circuit 2a with pulses øTGa for reading charges, and the first and second pulse lines L1a, L2a with two-phase drive pulses ø1, ø2 that are supplied to the first charge transfer circuit 3a to output charges in synchronism.

Charge reading pulses øTGa, øTGb, øTGc are supplied respectively to the first, second, and third charge read circuits 2a, 2b, 2c to transfer charges stored in the first, second, and third photodetector circuits 1a, 1b, 1c through the first, second, and third charge read circuits 2a, 2b, 2c to the first, second, and third charge transfer circuits 3a, 3b, 3c. A shutter pulse øSTa is supplied to the shutter gate 15a to drain charges stored in the first, second, and third photodetector circuits 1a, 1b, 1c through the shutter gate 15a to the shutter drain 16a.

Since the shutter pulse øSTa forces the charges to drain out of the first, second, and third photodetector circuits 1a, 1b, 1c, the shutter pulse øSTa is able to control the charges stored in the first, second, and third photodetector circuits 1a, 1b, 1c.

Figure 7:
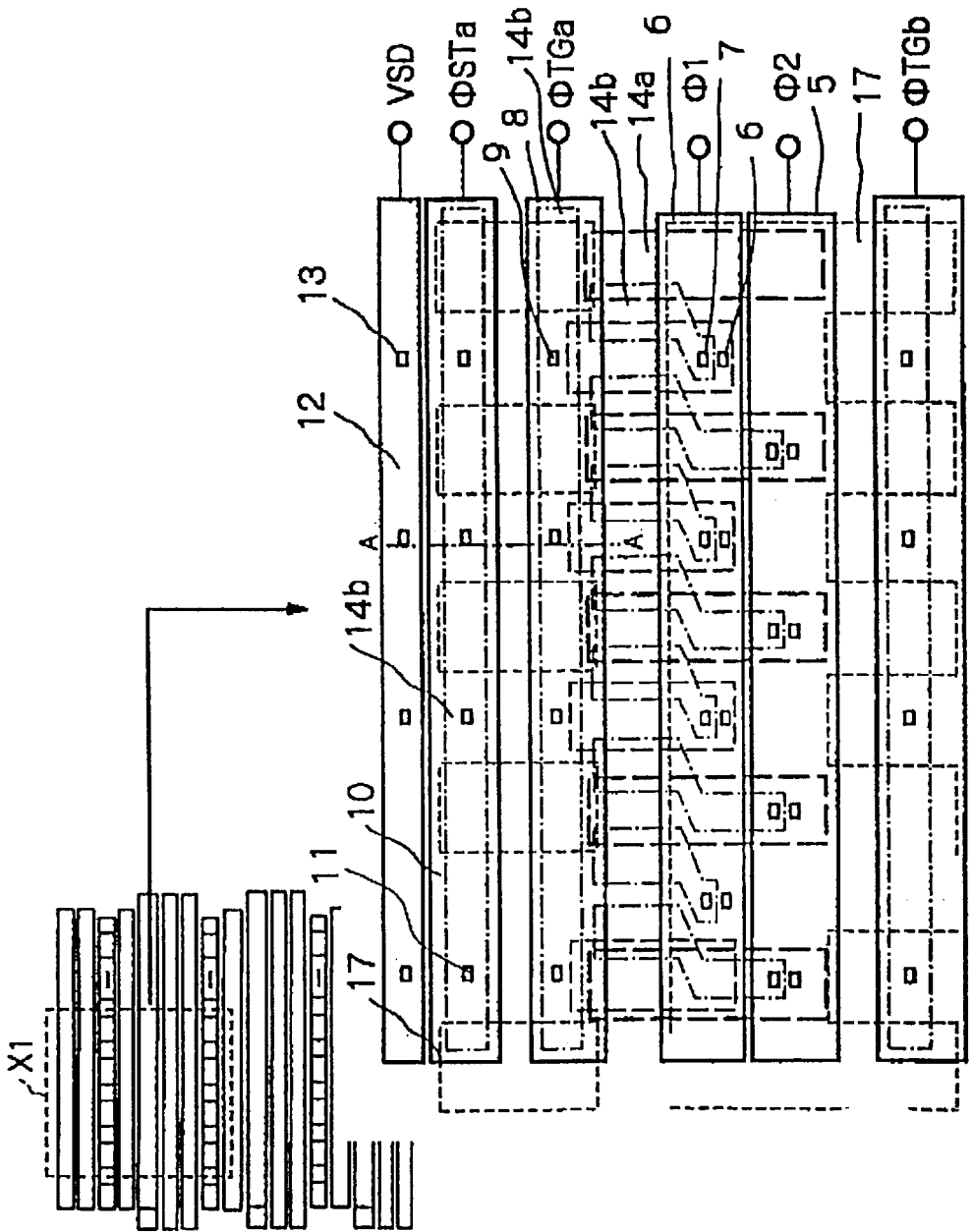
FIG. 7 is an enlarged view of an area of the color linear image sensor device shown in FIG. 6, the area being indicated as X1 by the dotted lines.

FIG. 7 Is an enlarged view of an area of the color linear image sensor device shown in FIG. 6 in a lower figure section, the area being indicated as X1 by the dotted lines in an upper figure section.

In FIG. 7, polycrystalline silicon electrodes 14a, 14b indicated by the thick dot-and-dash lines and dotted lines, device separating areas 17 indicated by the thin dotted lines, contacts 7, 9, 11, 13 indicated as small squares, and aluminum interconnections 5, 6, 10, 12 indicated as rectangles by the solid lines.

The absence of the shutter function other than one color image sensor in the above embodiment precludes an adjustment of the amounts of exposure in the photodetector circuits and an achievement of the same saturated output level as in the conventional arrangement.

However, in the case where one linear image sensor has higher sensitivity and the other two have substantially the same sensitivity to each other, this is as effective as having the same shutter function for three colors. Also in the case where the three linear image sensors have different sensitivities, the linear image sensors with the highest and middle sensitivities can achieve the same saturated output level, and the remaining linear image sensor is effective for a substantially increased saturated output level.

The reasons for the forgoing advantages of the color linear image sensor device according to the embodiment will be described below.

Figure 8:
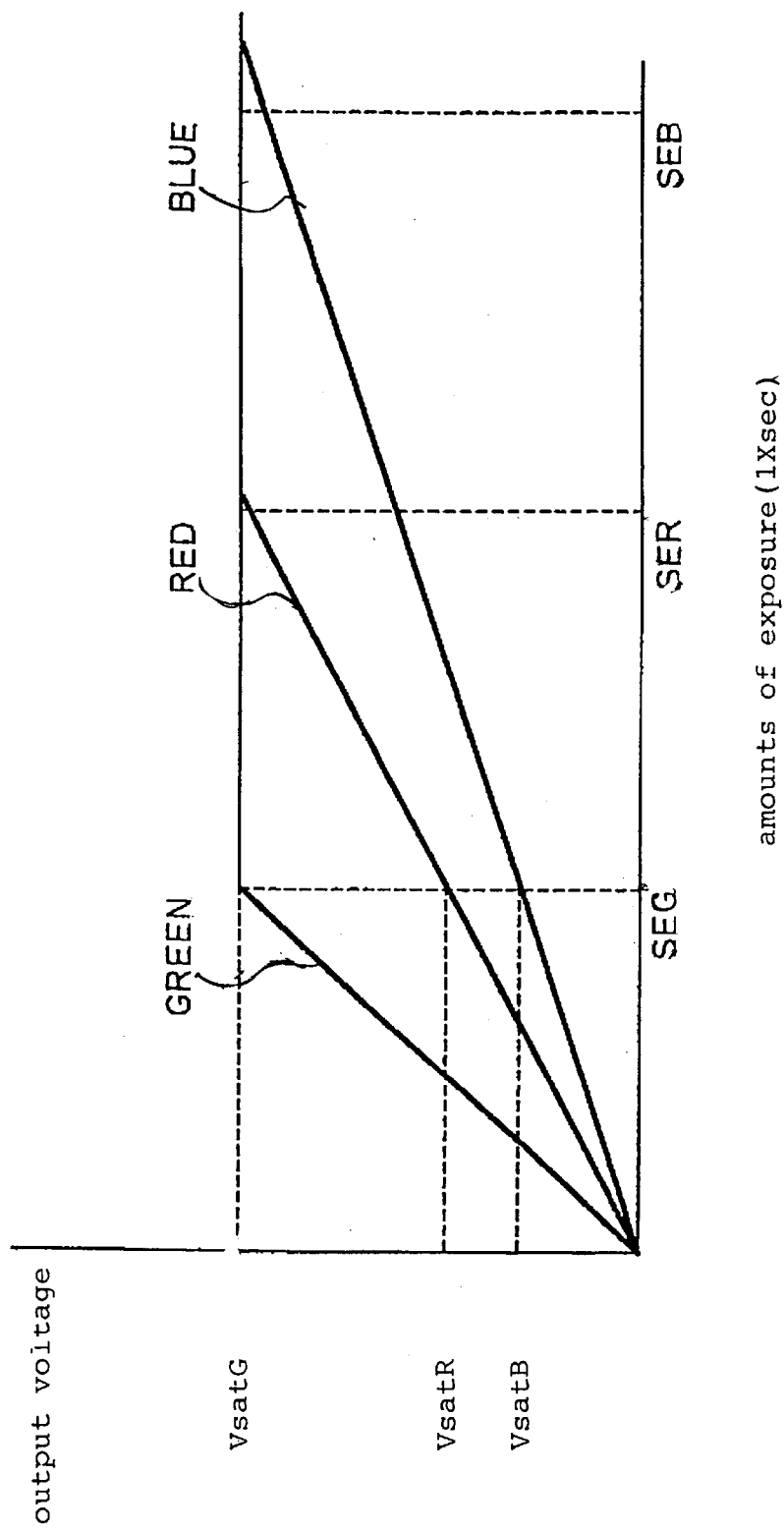
FIG. 8 is a diagram showing the relationship between the amount of exposure and the output voltage.

FIG. 8 shows the relationship between the amount of exposure and the output voltage. In FIG. 8, the horizontal axis represents the amount of exposure (1x. sec: lux/sec.), and the vertical axis represents the output voltage (V). Suppose that the GREEN color linear image sensor with the highest sensitivity disposed at the outermost and provided with a shutter function, as described above, the saturated output voltages of the GREEN and RED linear image sensors can be made to achieve the same saturated output level by adjusting the amount of exposure of the GREEN linear image sensor with the shutter function.

On the other hand, the BLUE linear image sensor has a saturated output voltage VsatB for the case when the GREEN linear image sensor having no shutter function allows an increment in the amount of exposure to SEG. The output voltage from the BLUE linear image sensor will be increased to a value corresponding to SER.

Figure 9:
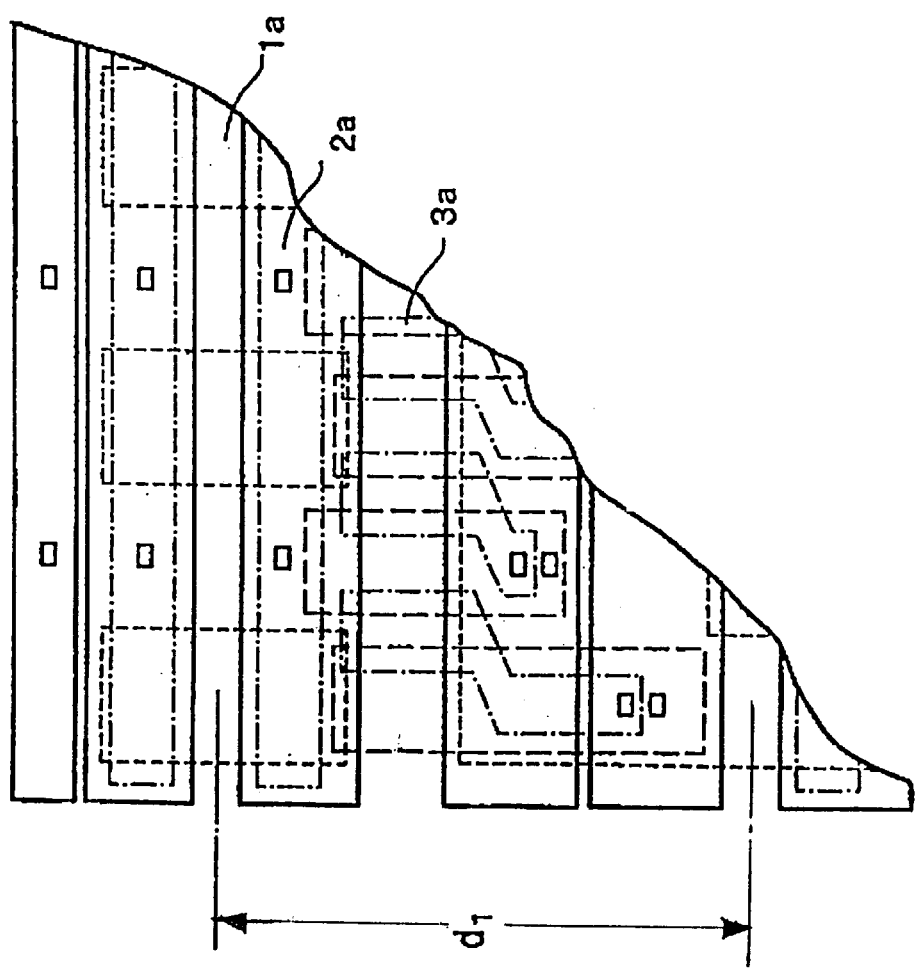
FIG. 9 is a fragmentary view of the enlarged area of the color linear image sensor device shown in FIG. 7.

FIG. 9 is a fragmentarily view of the enlarged area of the color linear image sensor device shown in FIG. 7.

In FIG. 9, the shutter gate 15a and the shutter drain 16a disposed at the first photodetector circuit 1a do not affect the interlinear distance d1, the same interlinear distance is feasible as the linear distance in the conventional linear image sensor without shutter function as shown in FIG. 7. Specifically, since the shutter gate 15a and the shutter drain 16a are disposed on the opposite side of the first charge read circuit 2a, they do not affect the interlinear distance d1 at all.

Figure 10:
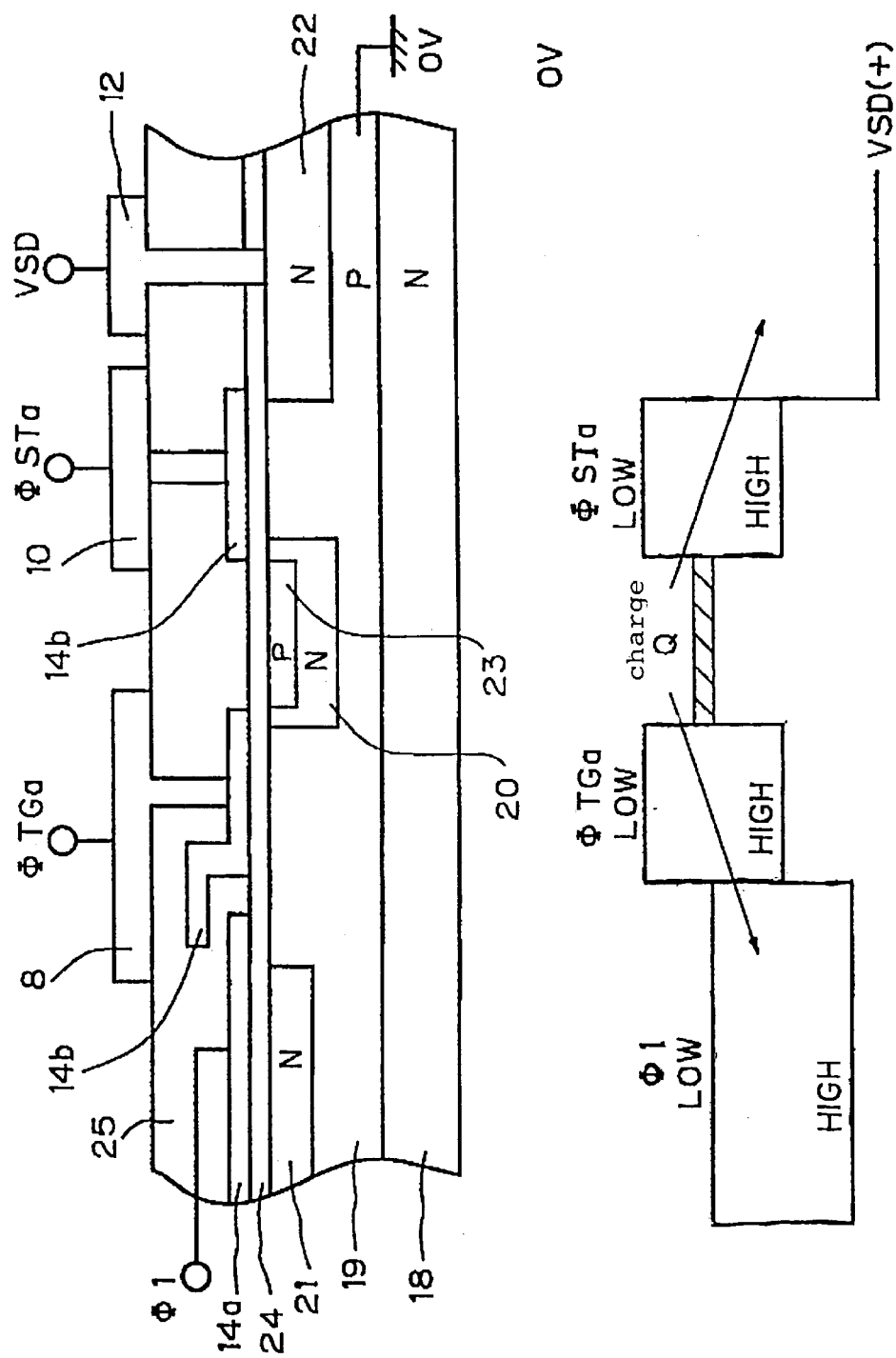
FIG. 10 is a fragmentary cross-sectional view taken along line A–A' of FIG. 7, also showing various regions, a channel potential, and charges Q.
Figure 11A:
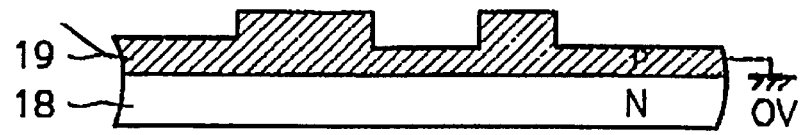
FIGS. 11A through 11E are fragmentary cross-sectional views showing successive steps of a process of manufacturing the color linear image sensor device shown in FIG. 10.
Figure 11B:
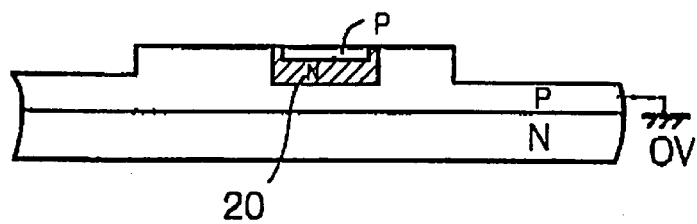
Figure 11C:
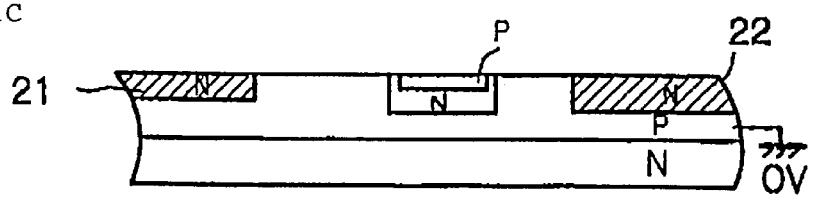
Figure 11D:
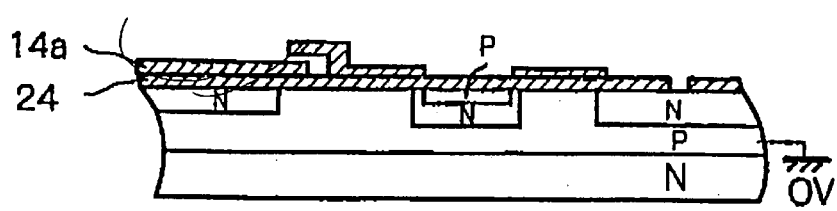
Figure 11E:
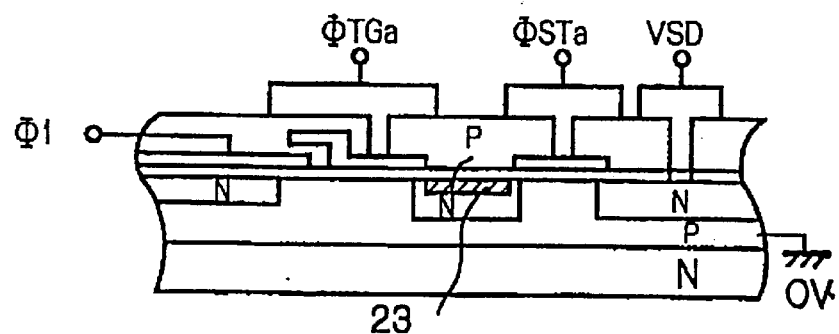

FIG. 10 is a fragmentary cross-sectional view taken along line A–A' of FIG. 7, also showing various regions, a channel potential, and charges Q.

FIGS. 11A through 11E show successive steps of a process of manufacturing the color linear image sensor device shown in FIG. 10. The process of manufacturing the color linear image sensor device according to the first embodiment will be described below with reference to FIGS. 6, 7, and 11A through 11E. FIGS. 11A through 11E show the region along line A–A' of FIG. 7 and correspond to the region around photodetector 1a (i.e., green). The regions for 1b and 1c are similar.

(1) Formation of a P-type well (FIG. 11A):

A P-type impurity of boron or the like is introduced at a concentration of about $1.0E12\text{-}13/(cm*cm)$ into a semiconductor substrate 18 with ion implantation, and then thermally diffused at a high temperature of about 1200° C. for about 10 hours, thereby forming a P-type well 19. A reference potential (not shown) is supplied from an external source to the P-type well 19.

(2) Formation of an N-type region (FIG. 11B):

Then, an N-type impurity of phosphorus or arsenic is introduced at a concentration of about $1.0E12/(cm*cm)$ into predetermined areas 20 where the first, second, and third photodetector circuits 1a, 1b, 1c are formed, with an energy of about 100 KeV with ion implantation, and then thermally diffused at a high temperature of about 1100° C. for about 1 hour, thereby forming an N-type region 20. Region 20 becomes photodetector 1a as shown in FIG. 10.

Figure 1:
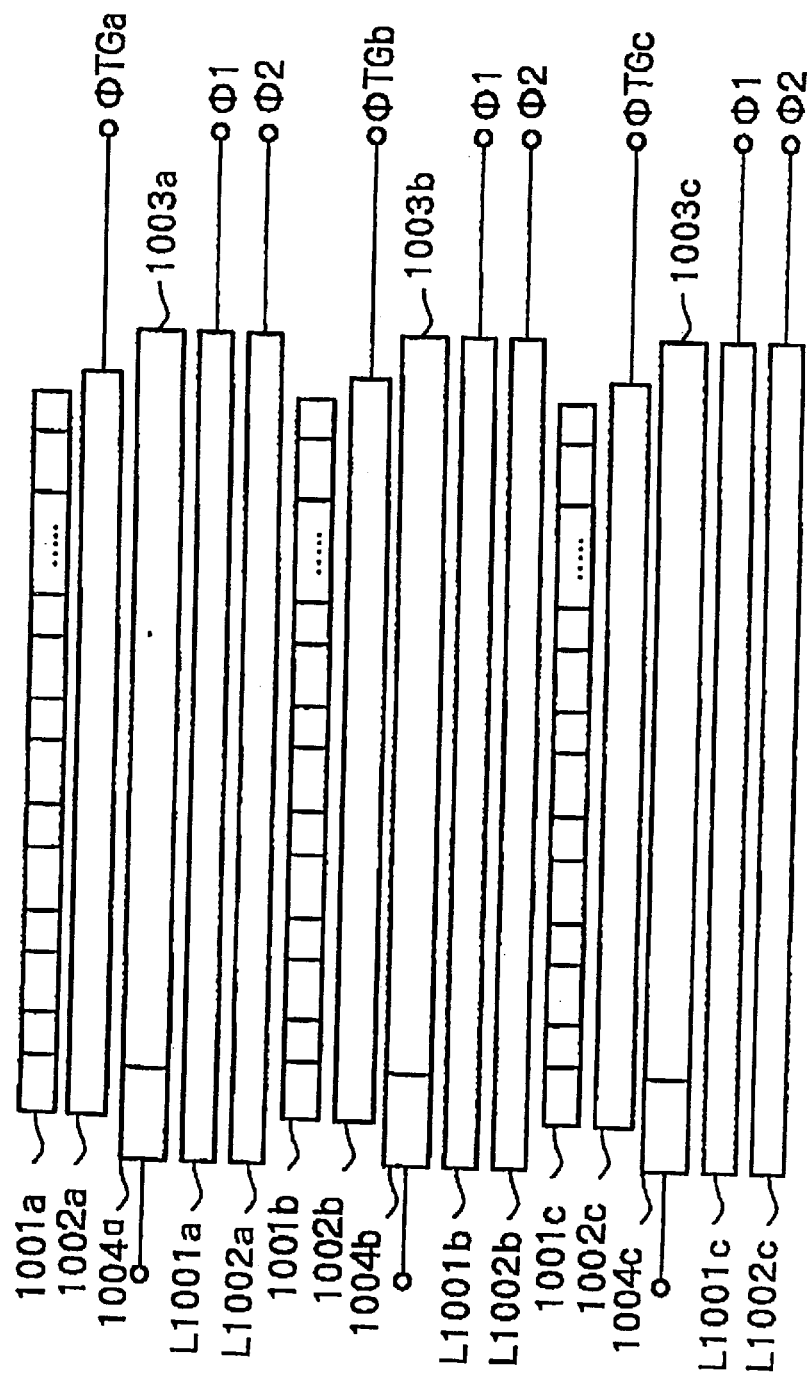
FIG. 1 is a view showing an overall arrangement of a conventional color linear image sensor.

(3) Formation of N-type regions (FIG. 1C):

Similarly, an N-type impurity of phosphorus or arsenic is introduced at a concentration of about $1.0E11\text{-}12/(cm*cm)$ into predetermined areas where the first, second, and third charge transfer circuits 3a, 3b, 3c and the shutter drain 16a are formed, with an energy ranging from about 50 to 100 KeV with ion implantation, and then thermally diffused at a high temperature of about 1000° C. for about 3 hours, thereby forming N-type regions 21, 22.

(4) Formation of a shutter gate, charge read circuits, and charge transfer circuits (FIG. 11D):

Polycrystalline silicon electrodes 14a, 14b having a thickness ranging from about 400 to 500 nm are made in pattern-like shape in predetermined areas 24 using a thermally oxidized film having a thickness of about 100 nm as an insulating film, thereby forming a shutter gate 15a, first, second, and third charge read circuits 2a, 2b, 2c, and first, second, and third charge transfer circuits 3a, 3b, 3c.

(5) Formation of photodetector circuits and interconnections (FIG. 1E):

A P-type impurity having a concentration of about $1.0E12/(cm*cm)$ is introduced into the surface where the polycrystalline silicon electrodes 14a, 14b have been formed, using the polycrystalline silicon electrodes 14a, 14b as masks, with an energy of about 40 KeV with ion implantation, thereby forming a P-type region 23 which provides first, second, and third photodetector circuits 1a, 1b, 1c, in self-alignment with the polycrystalline silicon electrodes 14a, 14b.

The above fabrication steps (1) through (5) from the P-type region 23, the P-type region 20, and a PN junction made up of p-type well 19. An embbeded-channel transistor is formed with the P-type well 19, the thermally oxidized film 24, and the polycrystalline silicon electrodes 14a, 14b, providing the first, second, and third charge transfer circuits 3a, 3b, 3c. The N-type regions 21, 22 are connected to the aluminum interconnection 12 by the contacts 13 to provide a shutter drain 16a.

Figure 12:
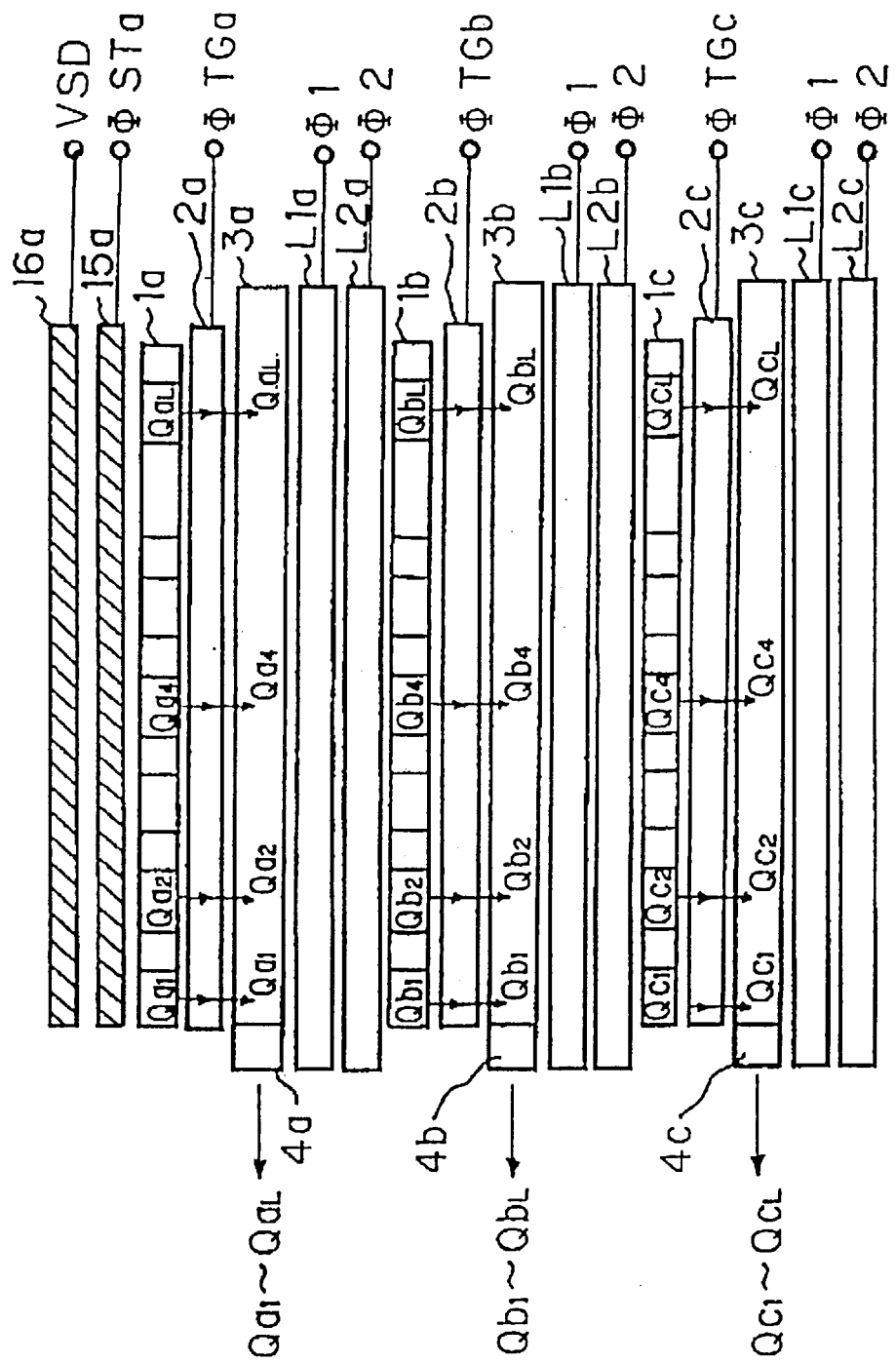
FIG. 12 is a view showing the manner in which charges move in various areas of the color linear image sensor device according to the first embodiment of the present invention.
Figure 13A:
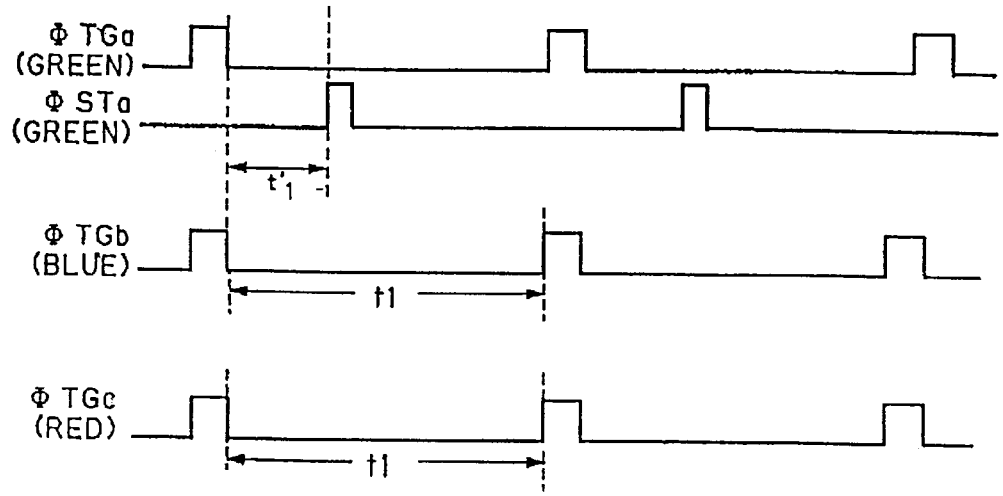
FIGS. 13A through 13C are diagrams showing pulses produced in various periods in the color linear image sensor device according to the first embodiment of the present invention.
Figure 13B:
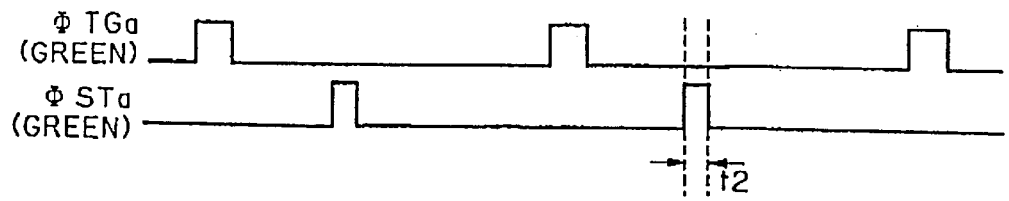
Figure 13C:
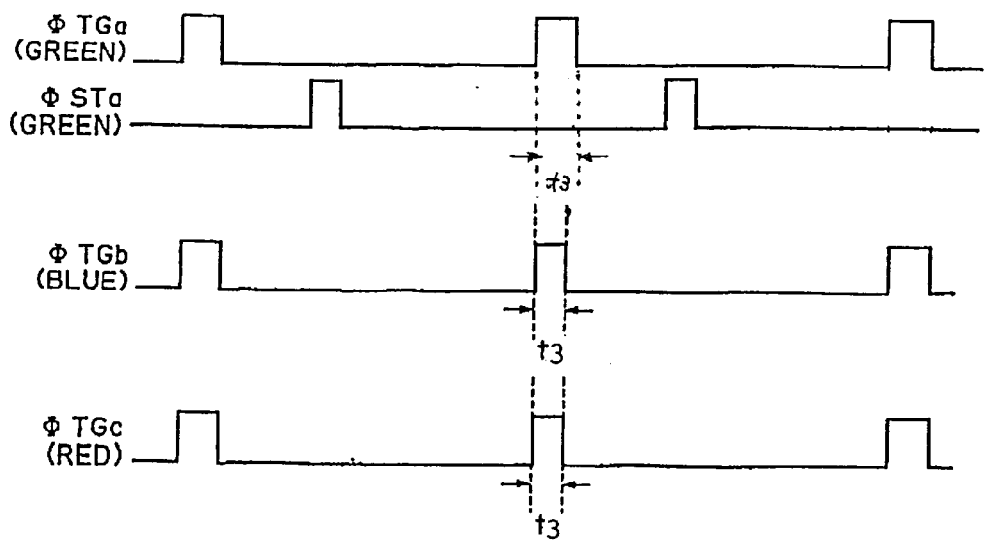

FIG. 12 shows the manner in which charges move in various areas of the color linear image sensor device according to the first embodiment of the present invention. FIGS. 13A through 13C show pulses produced in various periods in the color linear image sensor device according to the first embodiment of the present invention.

Figure 14A:
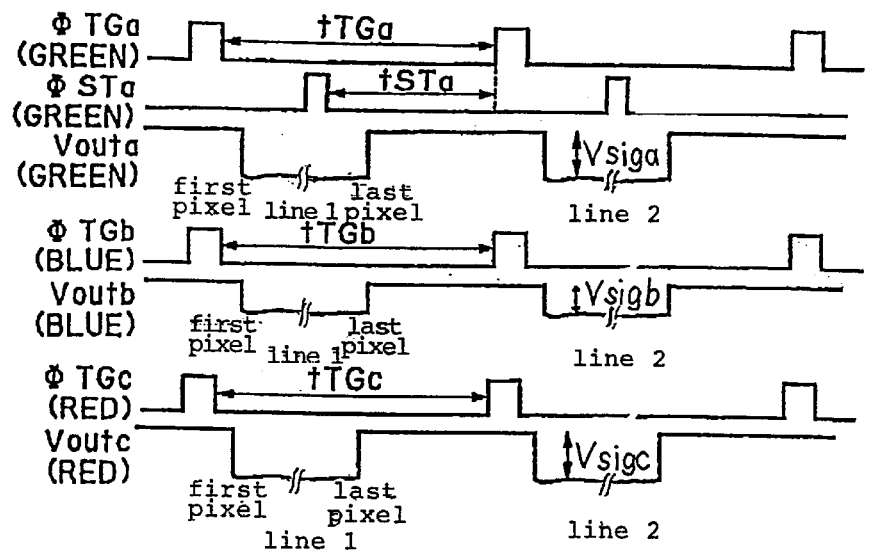
FIGS. 14A, 14B, and 14C are timing charts showing a timing of driving the color linear image sensor device according to the first embodiment of the present invention.
Figure 14B:
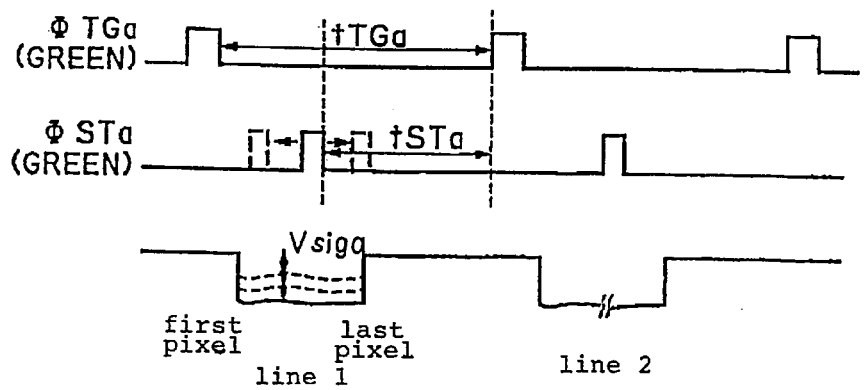
Figure 14C:
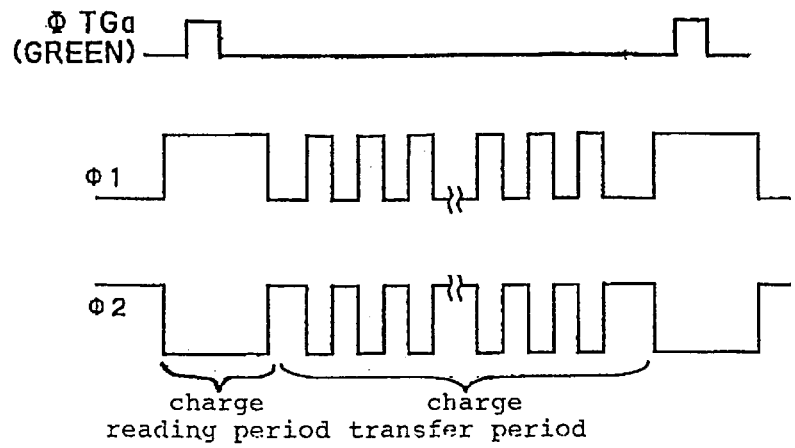

FIGS. 14A, 14B, and 14C are timing charts showing a timing of driving the color linear image sensor device according to the first embodiment of the present invention. In the example shown, the GREEN linear image sensor has the highest sensitivity, and the RED linear image sensor has middle sensitivity, and BLUE linear image sensor has the lowest sensitivity.

Further, the GREEN linear image sensor is disposed at the outermost and provided with the shutter gate 15a and the shutter drain 16a. In FIG. 14A, $\phi TGa$, $\phi TGb$, $\phi TGc$ represent pulses for reading charges, and $\phi STa$ represent shutter pulses.

With respect to the RED and BLUE linear image sensors, as shown in FIG. 14A, the amount of exposure is determined by the duration of low level periods of the pulses øTGb, øTGc applied to the first, second, and third charge read circuits 2a, 2b, 2c. That is, as the low level period of the pulses øTGc become longer, the amount of exposure become greater in proportion thereto, and as the low level period of the pulses øTGc become shorter, the amount of exposure become smaller in proportion thereto. As for the GREEN linear image sensor, as shown in FIG. 14B, the amount of exposure is determined by the interval tSTa of the puloses øSTa.

Suppose that all the storage times are equal to each other (tTGa=tTGb=tTGc), the average voltages Vsiga, Vsigb, Vsigc are related to each other as Vsiga=Vsigc>Vsigb. Since the pulse interval of the pulse øSTa can arbitrarily be changed as shown in FIG. 14B, the output voltage (Vsiga) of the GREEN linear image sensor can be made equal to the output voltage (Vsigc) of the RED linear image sensor whose sensitivity is middle. In this case, it becomes possible to make greater the output voltage of the BLUE linear image sensor than that without the shutter function.

FIG. 14C shows drive clocks ø1, ø2. For transferring charges smoothly from the charge read circuits 2a, 2b, 2c to the charge transfer circuits 3a, 3b, 3c, require fixing the drive clocks ø1, ø2 to high and low levels, respectively (ø1= HIGH, ø2=LOW) in the periods for reading the charges.

Operation of the color image linear sensor device according to the first embodiment of the present invention will be described in detail below with reference to FIGS. 12 and 13A–13C.

(1) Storage of charges (FIG. 13A):

When both the pulses øSTa supplied to the shutter gate 15a and the pulses øTGa supplied to the first charge read circuit 2a are low level in a period t1' shown in FIG. 13A, GREEN charges are stored in the photodetector circuit 1a. When both the pulses øTGb supplied to the second charge read circuit 2b and the pulses øTGc supplied to the third charge read circuit 2c are low level in a period t1 shown in FIG. 13A, RED and BLUE charges are stored in the photodetector circuits 1b, 1c, respectively.

(2) Draining of charges (FIG. 13B):

When the pulses øTGa remain low level and the pulses øSTa are high level in a period t2 shown in FIG. 13B, charges Q are drained into the shutter gate 15a which has a potential VSD, reducing charges in the first photodetector circuit 1a to zero level. Thereafter, when both the pulses øTGa and the pulses øSTa are low level again, charges are stored in the first photodetector circuit 1a. The absence of shutter function at the RED and BLUE linear image sensors drains no charges therefrom.

(3) Reading of charges (FIG. 13C):

When the pulses øSTa remain low level and the pulses øTGa are high level in a period t3 shown in FIG. 13C, GREEN charges Qa are read through the first charge read circuit 2a into the first charge transfer circuit 3a.

Subsequently, the charges Qa are outputted from the first charge transfer circuit 3a through the first signal output circuit 4a in synchronism with the first and second drive clocks ø1, ø2 that are supplied from the first and second pulse lines L1a, L2a.

When both the pulses øTGb and the pulses øTGc are high level, BLUE and EED charges Qb, Qc are outputted from the second and third charge transfer circuits 3b, 3cthrough the second and third signal output circuits 4b, 4c in synchronism with the third and fourth drive clocks ø1, ø2 and the fifth and sixth drive clocks ø1, ø2.

A color linear image sensor device according to a second embodiment of the present invention will be described below.

Figure 15:
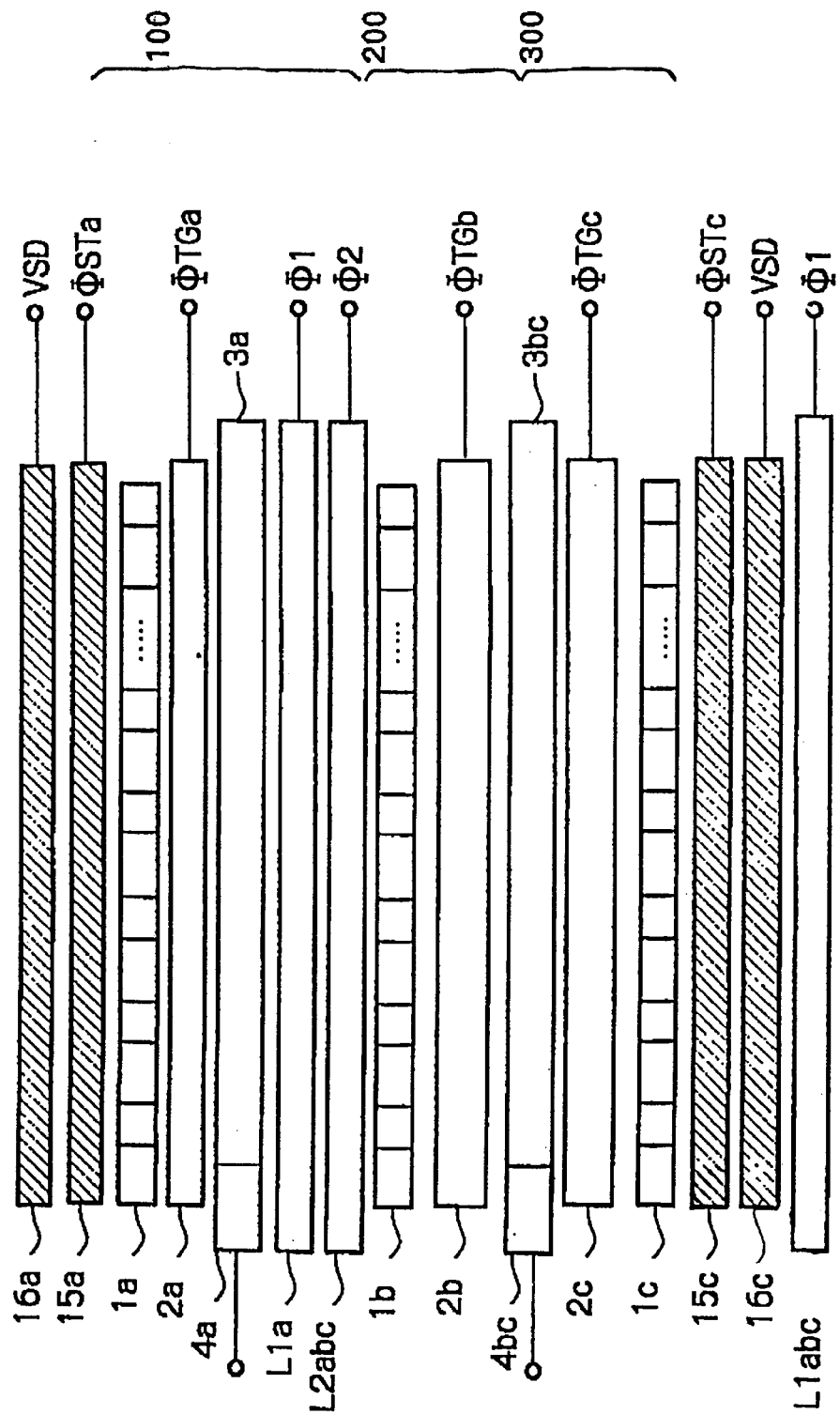
FIG. 15 is a view showing an overall arrangement of a color linear image sensor device according to a second embodiment of the present invention.

FIG. 15 shows an overall arrangement of a color linear image sensor device according to a second embodiment of the present invention. According to the second embodiment, as shown in FIG. 15, the color linear image sensor device comprises first, second, and third linear image sensors 100, 200, 300 having different sensitivities with respect to incident light, the linear image sensors 100, 200, 300 being provided with first, second, and third colors.

The first, second, and third linear image sensors 100, 200, 300 are arranged successively in order of linear image sensor whose sensitivity to incident light is the highest, the linear image sensor whose sensitivity to incident light is the lowest, and the linear image sensor whose sensitivity to incident light is middle. A shutter gate 15a and a shutter drain 16a for adjusting the amount of exposure of the first linear image sensor 100 disposed at the first linear image sensor 100 whose sensitivity to incident light is the highest. A shutter gate 15c and a shutter drain 16c for adjusting the amount of exposure of the third linear image sensor 300 are disposed at the third linear image sensor 300 whose sensitivity to incident light is middle.

The characteristics of the second embodiment are that the shutter gates 15a, 15c and the shutter drains 16a, 16c for adjusting the amount of the exposure are disposed at the first and third linear image sensors 100, 300.

The first linear image sensor 100 comprises a first photodetector circuit 1a for converting light in GREEN into charges, a first charge read circuit 2a for reading the charges generated by the first photodetector circuit 1a, a first charge transfer circuit 3a for transferring the charges read by the first charge read circuit 2a in synchronism with first and second drive clocks ø1, ø2, a first signal output circuit 4a for converting the charges transferred by the first charge transfer circuit 3a into a voltage and outputting the voltage, and first and second pulse lines L1a, L2abc for supplying first and second drive clocks to the first charge transfer circuit 3a.

The second linear image sensor 200 comprises a second photodetector circuit 1b for converting light in RED into charges, a second charge read circuit 2b for reading the charges generated by the second photodetector circuit 1b, a second charge transfer circuit 3bc for transferring the charges read by the second charge read circuit 2b in synchronism with second and third drive clocks ø1, ø2, and a second signal output circuit 4bc for converting the charges transferred by the second charge transfer circuit 3bc into a voltage and outputting the voltage.

The third linear image sensor 300 comprises a third photodetector circuit 1c for converting light in BLUE into charges, a third charge read circuit 2c for reading the charges generated by the third photodetector circuit 1c, the second charge transfer circuit 3bc for transferring the charges read by the third charge read circuit 2c in synchronism with second and third drive clocks ø2, ø1', the second signal output circuit 4bc for converting the charges transferred by the third charge transfer circuit 3bc into a voltage and outputting the voltage, and a third pulse line L1abc for supplying the third drive clock ø1' to the second charge transfer circuit 3bc.

In the color linear image sensor device according to the second embodiment, the second charge transfer circuit 3bc and the second signal output circuit 4bc are shared by the second linear image sensor 200 and the third linear image sensor 300, and the third linear image sensor 300 has the single third pulse line L1abc so as not to affect the interlinear distance.

The second linear image sensor 200 and the third linear image sensor 300 share the second charge transfer circuit 3bc, and employ only one drive clock ø1' so as not to affect the interlinear distance.

A construction of the linear image sensor as above permits adjustment of the amounts of exposure of the two linear image sensors whose sensitivities are higher by the shutter function. Specifically, the amounts of exposure to the two linear image sensors whose sensitivities are higher are adjusted by the shutter function to appropriate amounts of exposure with the amount of exposure of the remaining linear image sensor adjusted to an optimum value by the pulses øTGb applied to the charge read circuit 2b.

Signal lines are connected to right-hand ends of the above components of the first, second, and third linear image sensors 100, 200, 300 as shown in FIG. 15. The shutter drains 16a, 16c are supplied with a power supply VSD, the shutter gates 15a, 15c with pulses øSTa, øSTc for storing charges, the first, second, and third charge read circuits 2a, 2b, 2c with pulses øTGa, øTGb, øTGc for reading charges, the first and second pulse lines L1a, L2abc with drive pulses ø1, ø2, and the third pulse line L1abc with pulses ø1'.

Figure 16:
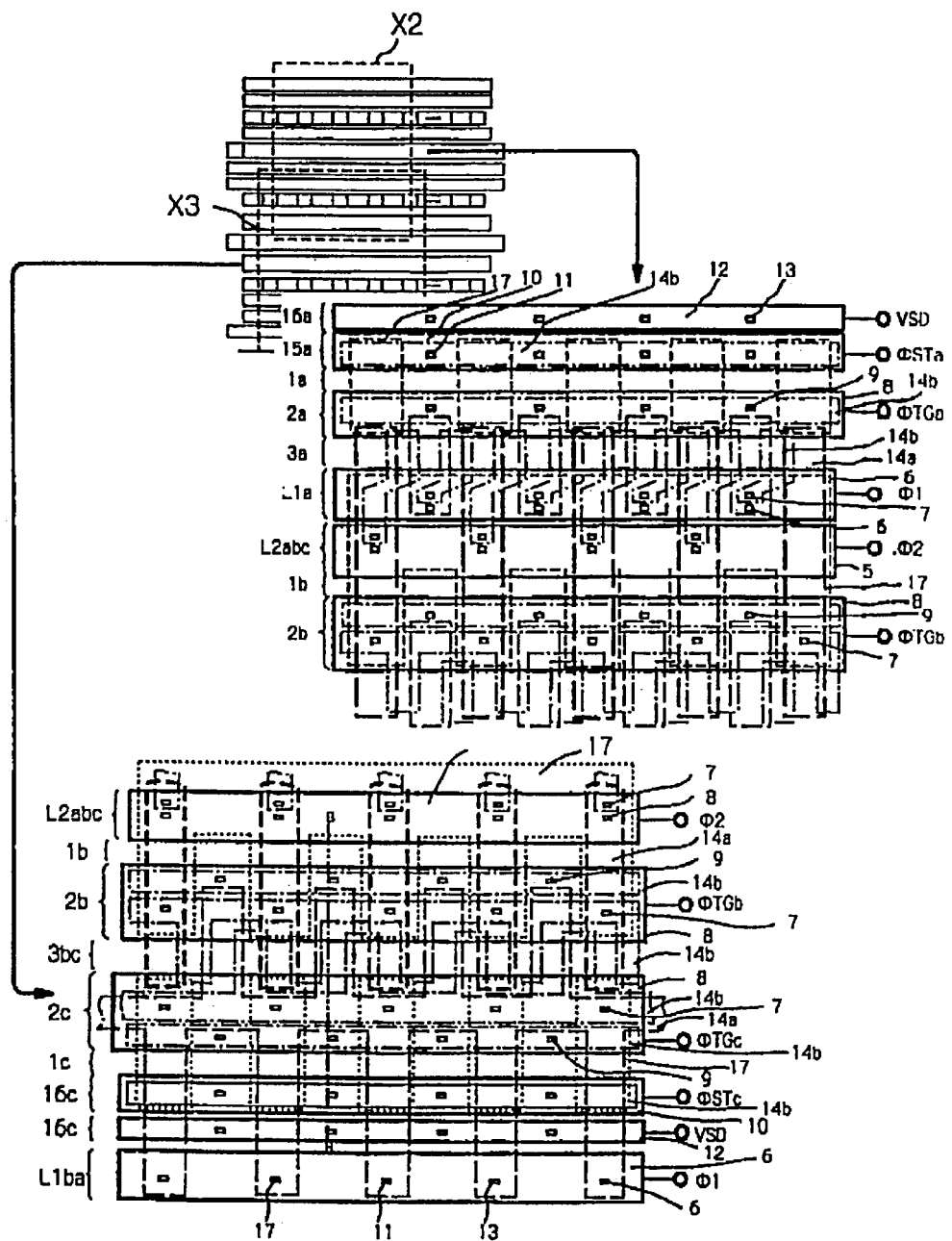
FIG. 16 is an enlarged view of areas of the color linear image sensor device shown in FIG. 15, the areas being indicated as X2, X3 by the dotted lines.
Figure 17:
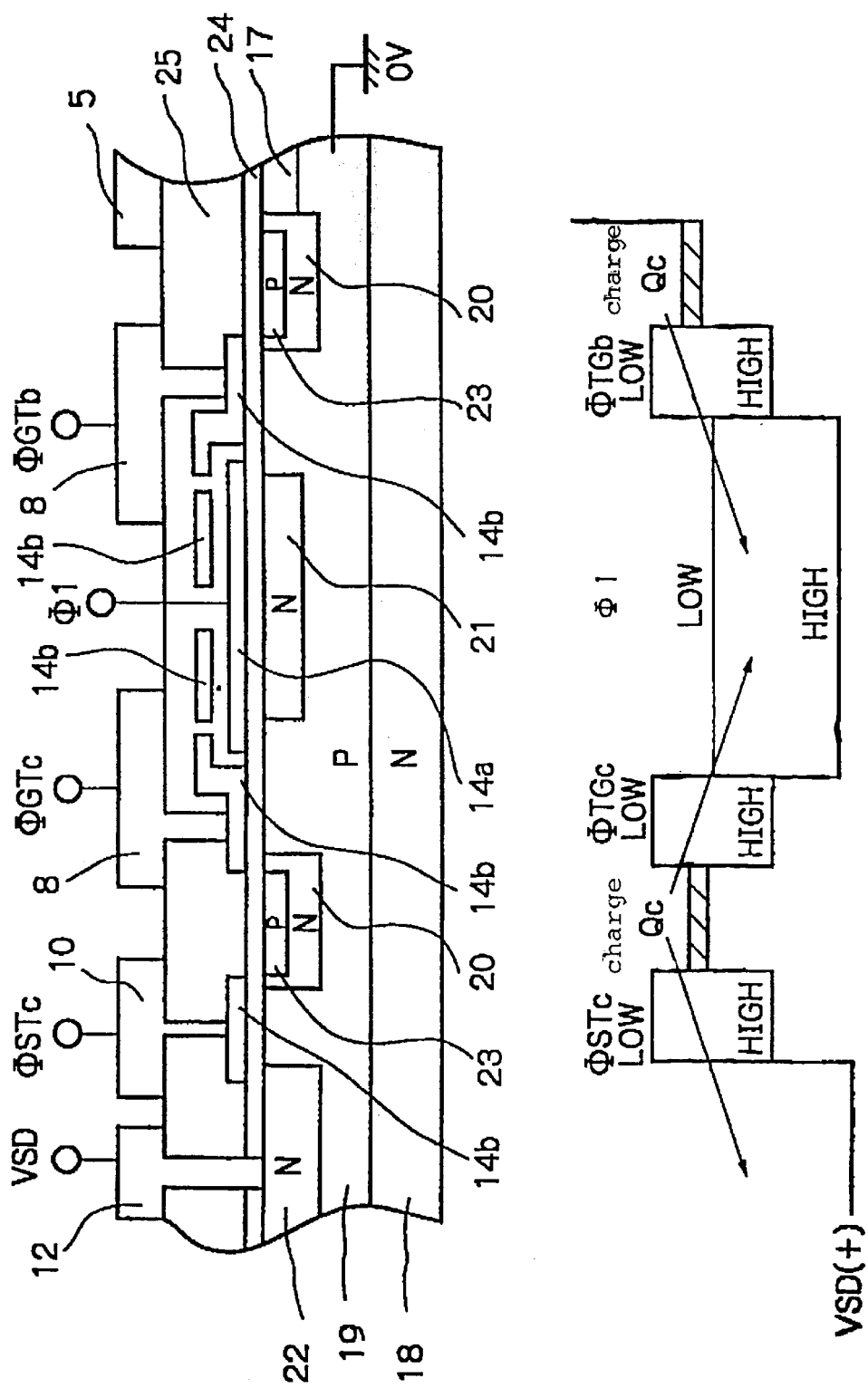
FIG. 17 is a fragmentary cross-sectional view taken along line B–B' of FIG. 16, also showing various regions, a channel potential, and charges Q.
Figure 18A:
FIGS. 18A through 18E are fragmentary cross-sectional views showing successive steps of a process of manufacturing the color linear image sensor device shown in FIG. 17.
Figure 18B:
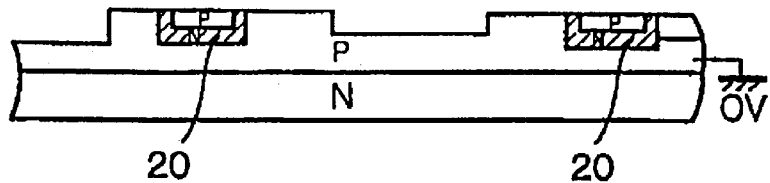
Figure 18C:
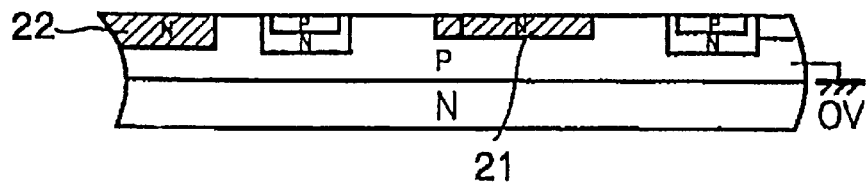
Figure 18D:
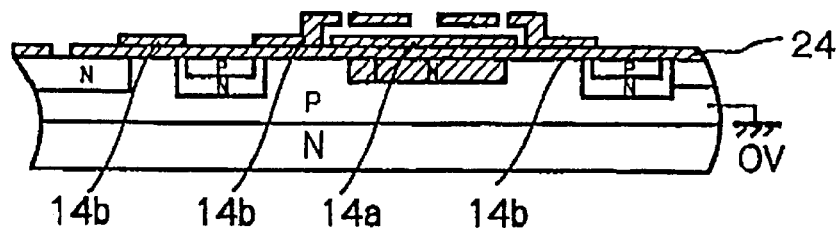
Figure 18E:
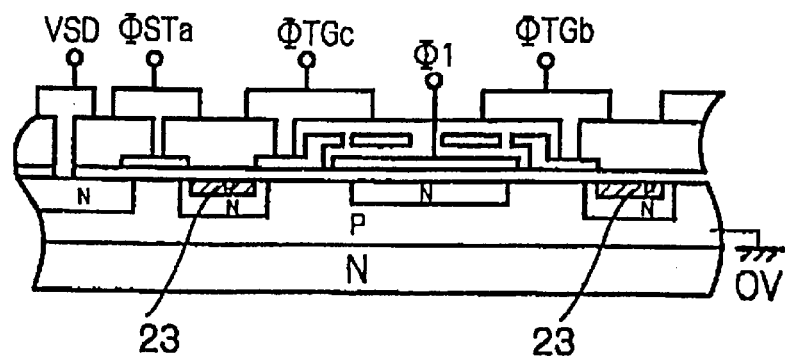

FIG. 16 an enlarged view of areas of the color linear image sensor device shown in FIG. 15, the areas being indicated as X2, X3 by the dotted lines. FIG. 17 is a fragmentary cross-sectional view taken along line B–B' of FIG. 16, also showing various regions, a channel potential, and charges Q.

Figure 2:
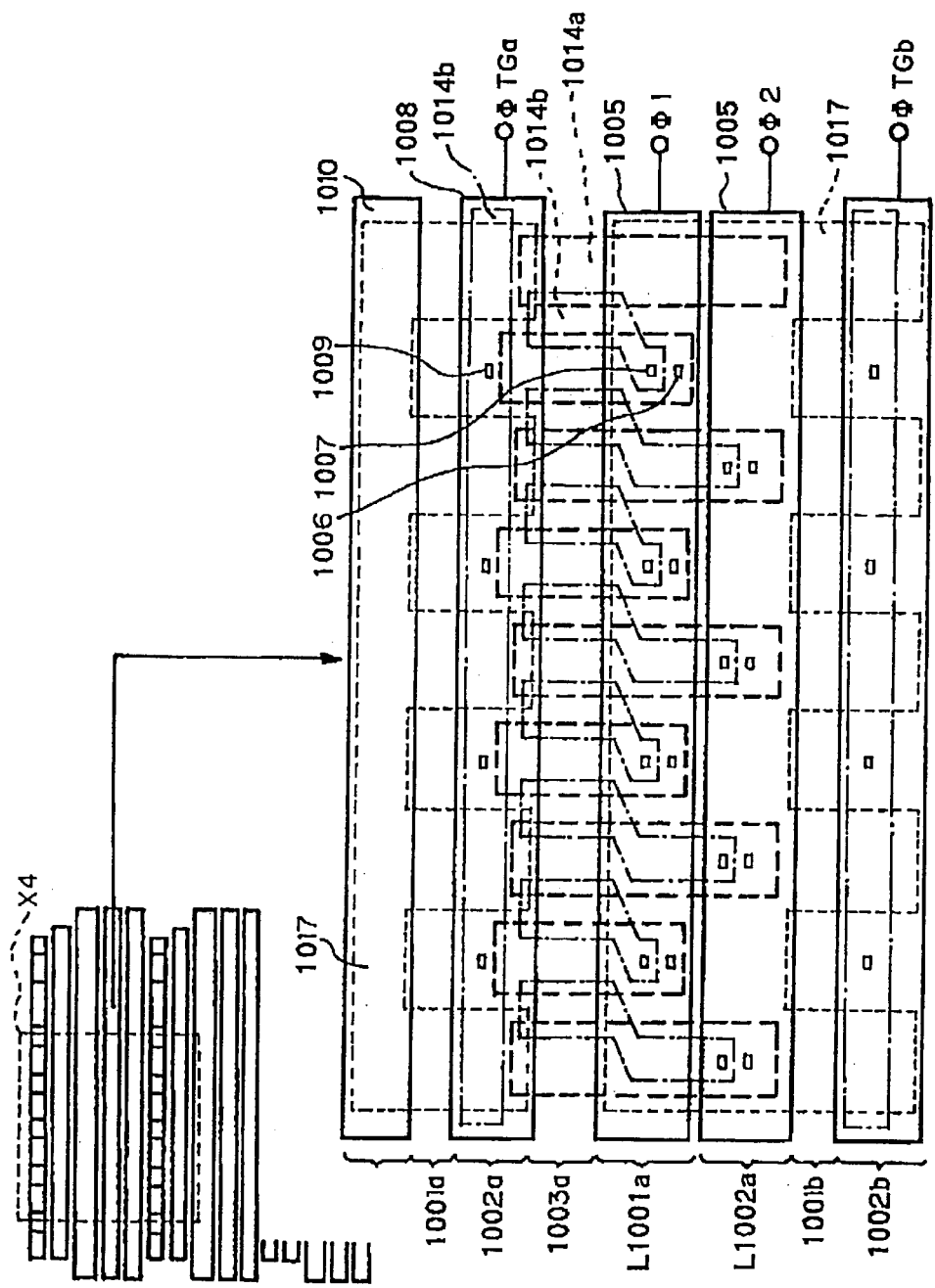
FIG. 2 is a view showing a detailed structure of the conventional color linear image sensor shown in FIG. 1.
Figure 3A:
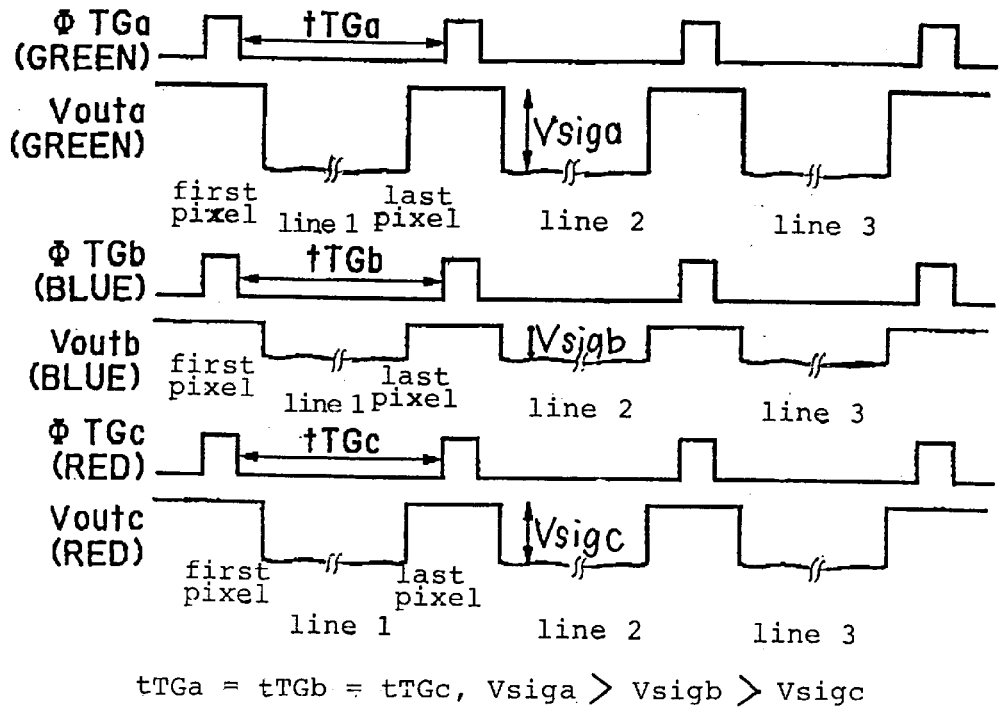
FIG. 3A is a timing chart representing a timing of driving the conventional color linear image sensor shown in FIG. 1.
Figure 3B:
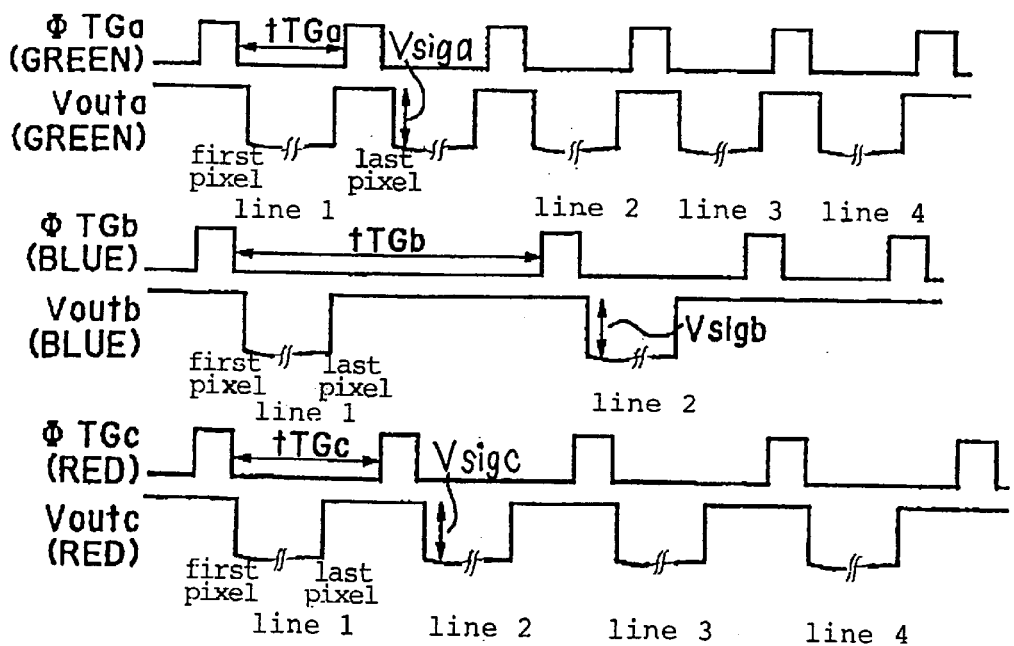
FIG. 3B a timing chart representing a timing of driving the conventional color linear image sensor shown in FIG. 1 not changing the storage times for charges with respect to the respective colors, but changing the amount of exposure depending the amount of incident light.
Figure 4:
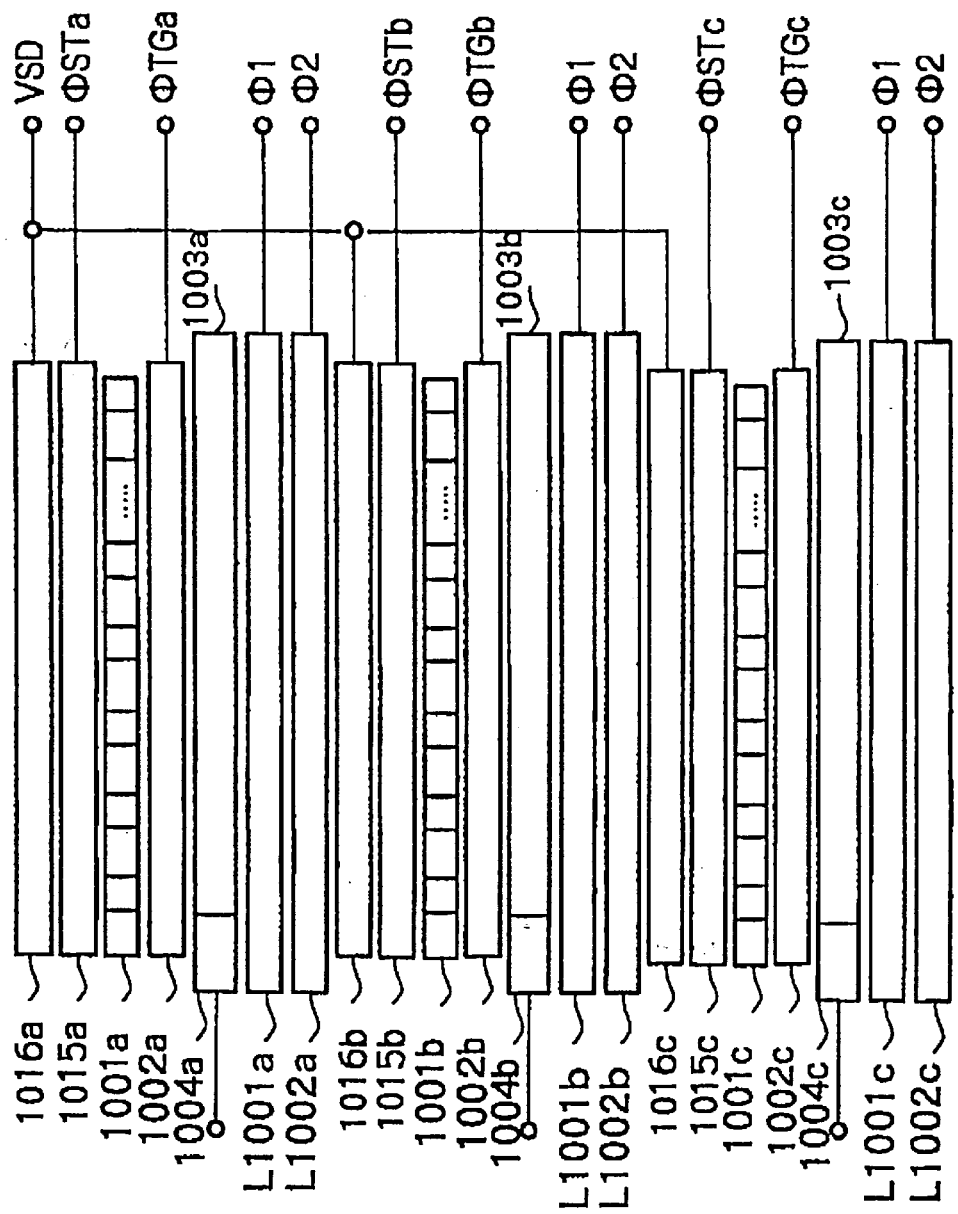
FIG. 4 is a view showing an overall arrangement of another conventional color linear image sensor.
Figure 5:
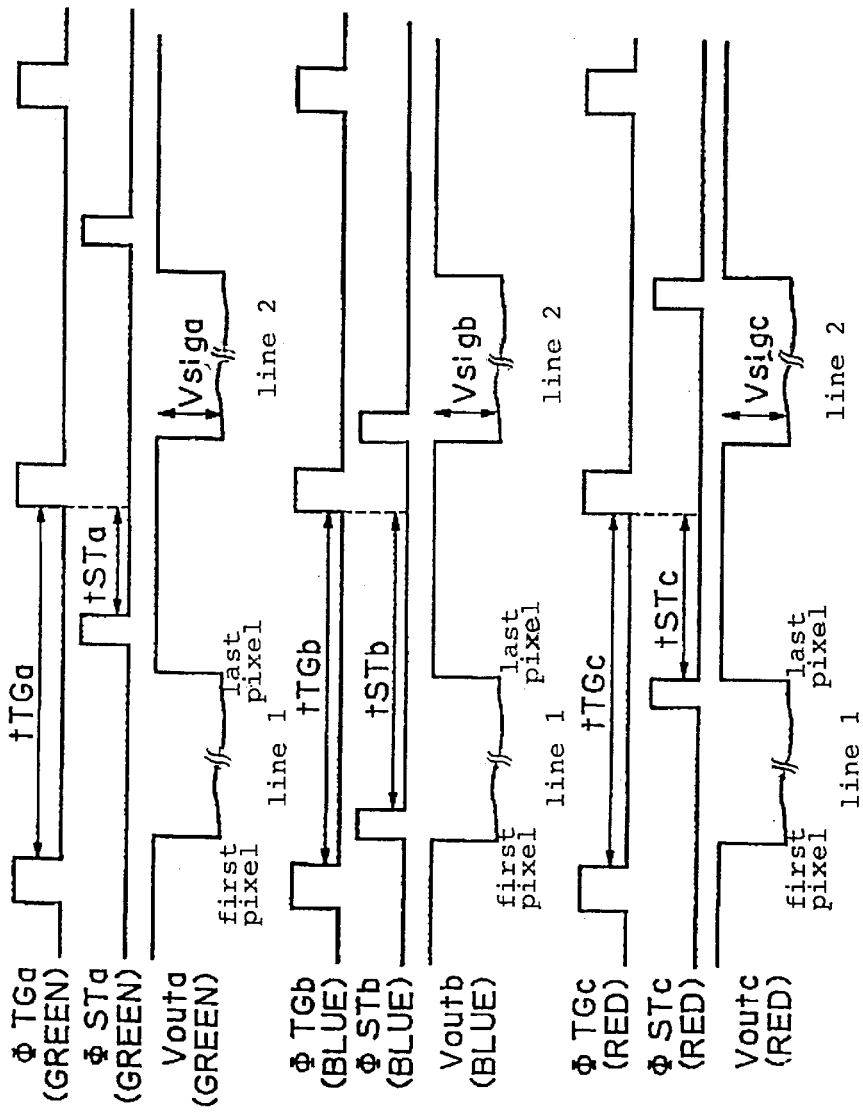
FIG. 5 is a timing chart representing a timing of driving the conventional color linear image sensor is shown in FIG. 4.

As can be seen from a comparison of the interlinear distances in the conventional linear image sensor shown in FIG. 2 and the color linear image sensor device shown in FIG. 16, the interlinear distance in the color linear image sensor device according to the second embodiment is exactly the same as the interlinear distance in the conventional linear image sensor shown in FIG. 2. The first shutter gate 15a and the first shutter drain 16a are disposed at the first photodetector circuit 1a on the opposite side of the first charge read circuit 2a so as not to affect the interlinear distance.

As shown in FIG. 15, the second photodetector circuit 1b and the third photodetector circuit 1c share the common second charge transfer circuit 3bc corresponding thereto, thereby reducing the interlinear distance between the first photodetector circuit 1a and the second photodetector circuit 1b. It is apparent that the interlinear distance between the first photodetector circuit 1a and the second photodetector circuit 1b would be increased if the individual charge transfer circuits were provided for them, respectively.

The second drive clock ø2 for driving the second charge transfer circuit 3bc is supplied to the second charge transfer circuit 3bc across the device separating areas 17 which separate the pixels of the second photodetector circuit 1b and the second charge read circuit 2c. Similarly, the first drive clock ø1 for driving the second charge transfer circuit 3bc is supplied to the second charge transfer circuit 3bc across the second shutter gate 15c, the second shutter drain 16c, the device separating areas 17 which separate the pixels of the third photodetector circuit 1c, and the second charge read circuit 2c. In this manner, the interlinear distance between the photodetector circuits 1a–1c is prevented from increasing.

Other details of the color linear image sensor device according to the second embodiment are the same as those of the color linear image sensor device according to the first embodiment.

As can be seen from FIGS. 15 and 16, the shutter gate 15a and the shutter drain 16a are disposed at the first photodetector circuit on the opposite side of the first charge read circuit 2a so as not to affect the interlinear distance.

The second charge transfer circuit 3bc corresponding to the second photodetector circuit 1b and the third photodetector circuit 1c is shared, and charges from the second photodetector circuit 1b and the third photodetector circuit 1c are read through the charge read circuits 2b, 2c into the common second charge transfer circuit 3bc.

As a result, the interlinear distance between the photodetector circuits 1a–1c is equal to the sum of the lengths of the photodetector circuits 1a–1c, the lengths of the charge read circuits 2a–2c, and the lengths of the charge transfer circuits 3a–3c.

A comparison of the second embodiment shown in FIG. 16 and the conventional arrangement shown in FIG. 2 indicates that while the lengths of the photodetector circuits 1a–1c and the lengths of the charge transfer circuits 3a–3c are the same, the size of the charge read circuits 1002a–1002c of the conventional arrangement is smaller than the size of the charge read circuits 2a–2c of the second embodiment.

The reason for the larger size of the charge read circuits 2a–2c is as follows: In the second embodiment, areas are required to connect contacts to the polycrystalline silicon electrodes 14a, 14b to which the drive clocks ø1, ø2 for driving the charge transfer circuits 3a, 3bc are applied in the charge read circuits 2a–2c. Each of those areas needs more to be of a size ranging from 10 to 15 µm (a total size ranging from 20 to 30 µm).

In the conventional arrangement shown in FIG. 2, however, the sizes of the pulse lines L100a–L100c, L1002a–L1002c for applying pulses to the charge transfer circuits 1003a–1003c are about 30 µm larger. Consequently, these size differences between the second embodiment and the conventional arrangement cancel each other, with the result that the interlinear distance between the photodetector circuits 1a–1c is almost the same as the interlinear distance in the conventional arrangement.

FIGS. 18A through 18E show successive steps of a process of manufacturing the color linear image sensor device shown in FIG. 17. The process of manufacturing the color linear image sensor device according to the second embodiment will be described below with reference to FIGS. 15, 16, and 18A through 18E.

(1) Formation of a P-type well (FIG. 18A):

A P-type impurity of boron or the like is introduced at a concentration of about 1.0E12-13/(cm*cm) into a semiconductor substrate 18 with ion implantation, and then thermally diffused at a high temperature of about 1200° C. for about 10 hours, thereby forming a P-type well 19. A reference potential (not shown) is supplied from an external source to the P-type well 19.

(2) Formation of an N-type region (FIG. 18B):

Then, an N-type impurity of phosphorus or arsenic is introduced at a concentration of about 1.0E12/(cm*cm) into predetermined areas where the first, second, and third photodetector circuits 1a, 1b, 1c are formed, with an energy of about 100 KeV with ion implantation, and then thermally diffused at a high temperature of about 1100° C. for about 1 hour, thereby forming an N-type region 20. Region 20 will become photodiodes 1b, 1c as shown by FIG. 17.

(3) Formation of N-type regions (FIG. 18C):

Similarly, an N-type impurity of phosphorus or arsenic is introduced at a concentration of about 1.0E11-12/(cm*cm)

into predetermined areas where the first and second charge transfer circuits 3a, 3bc and the first and second shutter drains 16a, 16c are to be formed, with an energy ranging from about 50 to 100 KeV with ion implantation, and then thermally diffused at a high temperature of about 1000° C. for about 3 hours, thereby forming N-type regions 21, 22. FIG. 17 shows circuit 3bc and drain 16c.

(4) Formation of shutter gates, charge read circuits, and charge transfer circuits (FIG. 18D):

Polycrystalline silicon electrodes 14a, 14b having a thickness ranging from about 400 to 500 nm are made in pattern-like shape in predetermined areas using a thermally oxidized film having a thickness of about 100 nm as an insulating film, thereby forming first and second shutter gates 15a, 15c, first, second, and third charge read circuits 2a, 2b, 2c, and first, second, and third charge transfer circuits 3a, 3b, 3c.

(5) Formation of photodetector circuits and interconnections (FIG. 18E):

A P-type impurity having a concentration of about 1.0E12/(cm*cm) is introduced into the surface where the polycrystalline silicon electrodes 14a, 14b have been formed, using the polycrystalline silicon electrodes 14a, 14b as masks, with an energy of about 40 KeV with ion implantation, thereby forming a P-type region 23 which provides first, second, and third photodetector circuits 1a, 1b, 1c, in self-alignment with the polycrystalline silicon electrodes 14a, 14b.

The above fabrication steps (1) through (5) allow formations of the P-type region 23, the P-type region 20, and a PN-junction made up of p-type well 19. An embedded-channel transistor is formed with the P-type well 19, the thermally oxidized film 24, and the polycrystalline silicon electrodes 14a, 14b, providing the first, second, and third charge transfer circuits 3a, 3b, 3c. The N-type regions 21, 22 are connected to the aluminum interconnection 12 by the contacts 13 to provide shutter drains 16a, 16c.

Figure 19:
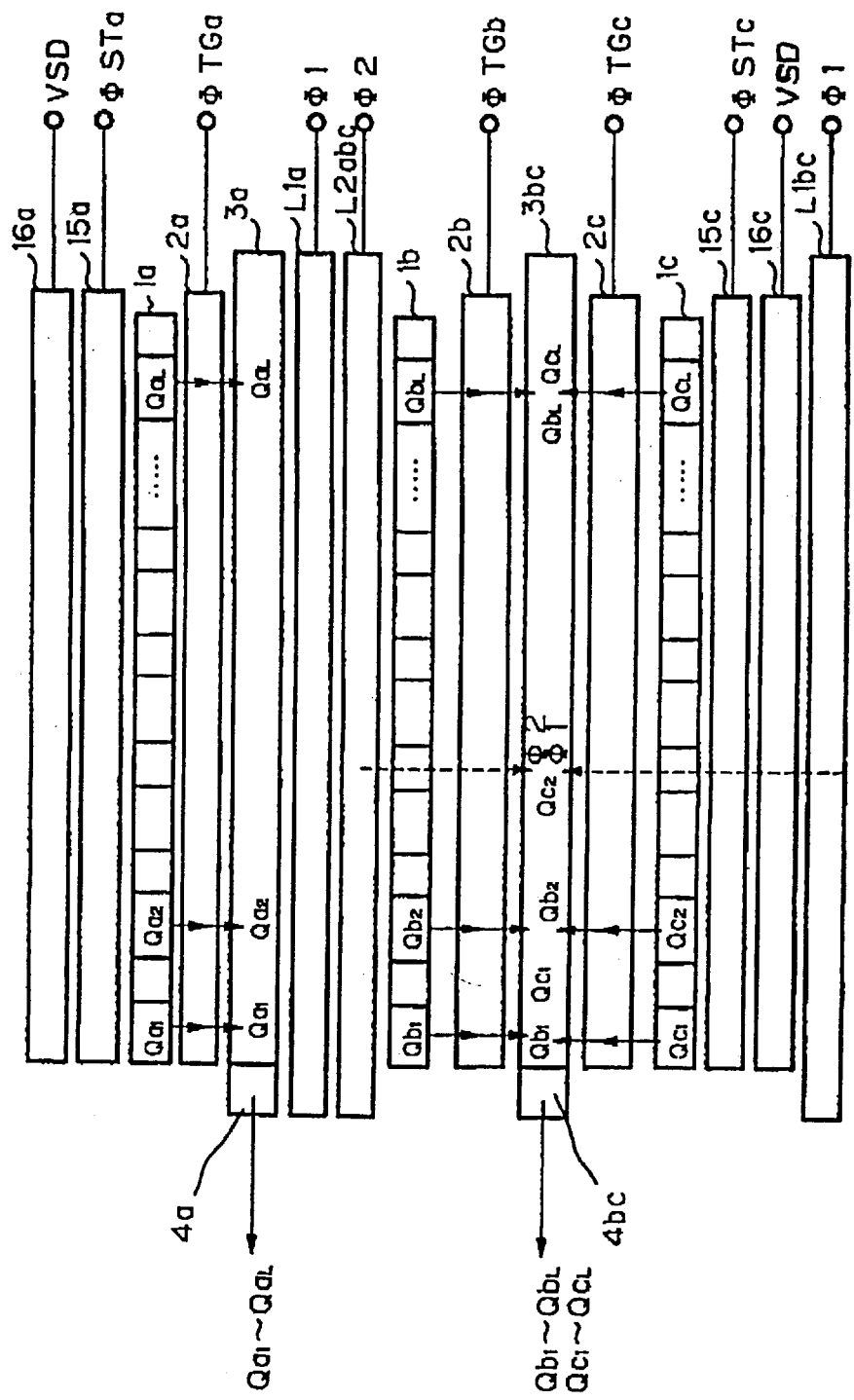
FIG. 19 is a view showing the manner in which charges move in various areas of the color linear image sensor device according to the second embodiment of the present invention.

FIG. 19 shows the manner in which charges move in various areas of the color linear image sensor device according to the second embodiment of the present invention. FIGS. 13A through 13C show pulses produced in various periods in the color linear image sensor device according to the second embodiment of the present invention.

Figure 21A:
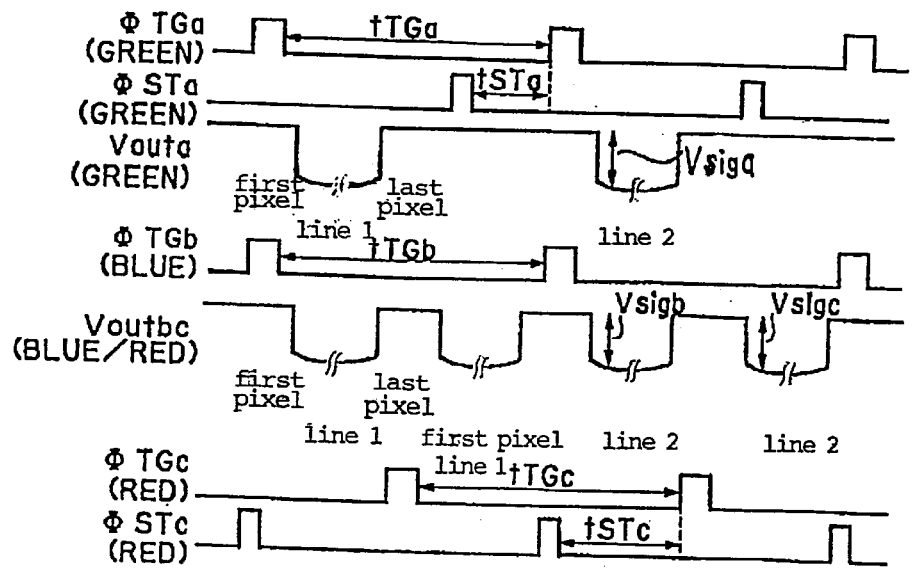
Figure 21B:
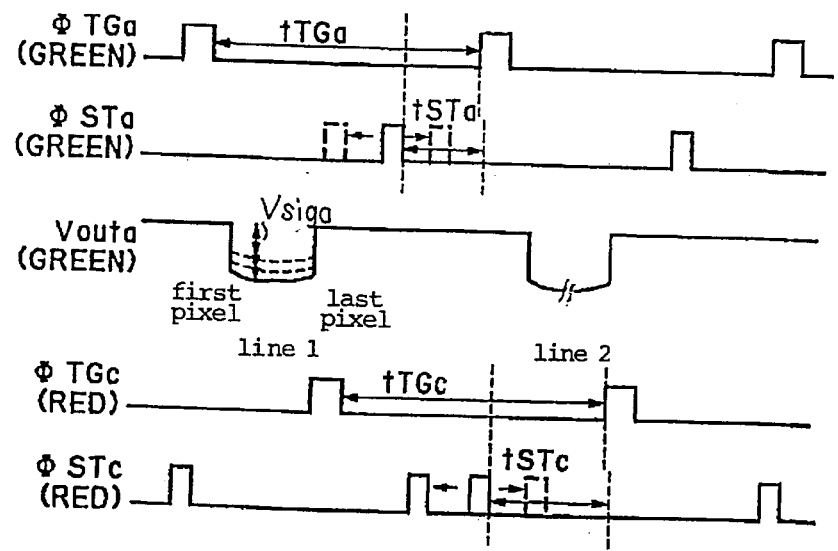
Figure 21C:
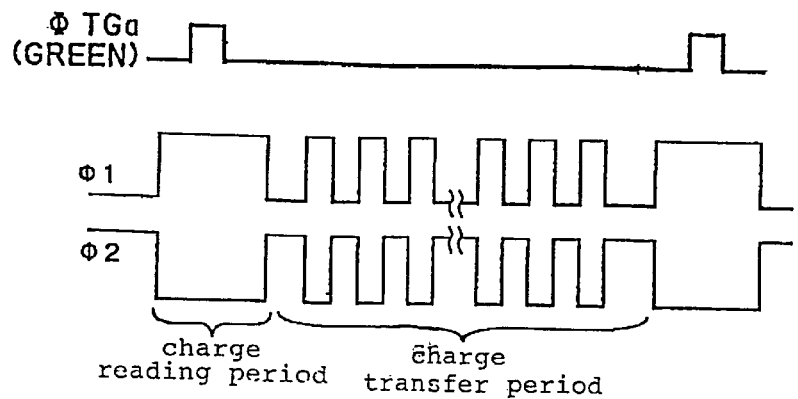

FIGS. 21A and 21B are timing charts showing a timing of driving the color linear image sensor device according to the second embodiment of the present invention. In the example shown, the GREEN linear image sensor has the highest sensitivity, and the RED linear image sensor has middle sensitivities, and BLUE linear image sensor has the lowest sensitivities.

In the second embodiment, the GREEN and RED linear image sensors are disposed respectively on both sides of the color linear image sensor device, and provided with respective shutter gates and respective shutter drains.

With respect to the BLUE and RED linear image sensors, as shown in FIG. 21A, the amount of exposure is determined by the duration of low level periods of the pulses øTGb which are applied to the first, second, and third charge read circuits 2a, 2b, 2c. That is, as the low level period of the pulses øTGb become longer, the amount of exposure become greater in proportion thereto, and as the low level period of the pulses øTGb become shorter, the amount of exposure become smaller in proportion thereto.

As for the GREEN and RED linear image sensors, shown in FIG. 21B, the amount of exposure is determined by the interval tSTa of the pulses øSTa and the interval tSTc of the pulses øSTc. Suppose that all the storage times are equal to each other (tTGa=tTGb=tTGc) and the pulse intervals øSTa, øSTc are related to each other as tSTc>tSTa, the average voltages Vsiga, Vsigb, Vsigc are equal to each other (Vsiga=Vsigc=Vsigb).

Since the pulse intervals of the pulses øSTa, øSTc can arbitrarily be changed as shown in FIG. 21B, the output voltage (Vsiga) of the GREEN linear image sensor, the output voltage (Vsigb) of the BLUE linear image sensor, and the output voltage (Vsigc) of the RED linear image sensor are made equal to each other. In this manner, the amount of exposure to the BLUE linear image sensor is adjusted to an optimum value, and the amounts of exposure to the GREEN and RED linear image sensors are adjusted by the shutter function, so that appropriate amounts of exposure can be achieved.

The GREEN and RED linear image sensors may be arranged freely.

Operation of the color image linear sensor device according to the second embodiment of the present invention will be described in detail below with reference to FIGS. 19 and 20A–20C.

In FIG. 19, the second drive clock ø2 and the third drive clock ø1 are supplied along respective paths indicated by the dotted-line arrows.

Figure 20A:
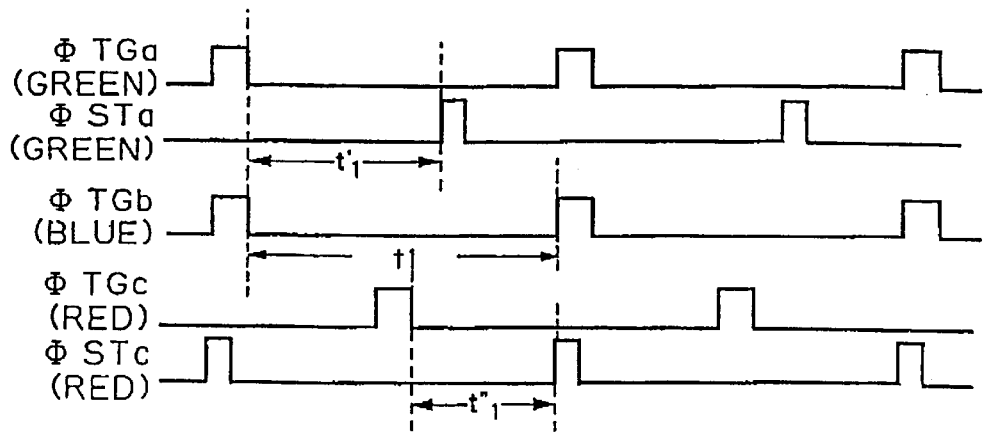
FIGS. 20A through 20C are diagrams showing pulses produced in various periods in the color linear image sensor device according to the second embodiment of the present invention.

(1) Storage of charges (FIG. 20A):

When both the pulses øSTa supplied to the first shutter gate 15a and the pulses øTGa supplied to the first charge read circuit 2a are low level in a period t1' shown in FIG. 20A, GREEN charges Qa are stored in the photodetector circuit 1a. When the pulses øTGb supplied to the second charge read circuit 2b are low in level in the period t1' shown in FIG. 13A, charges Qb are stored in the photodetector array 1b. When both the pulses øSTc supplied to the second shutter gate 15c and the pulses øTGc supplied to the third charge read circuit 2c are low level in a period t1" shown in FIG. 20A, charges Qb are stored in the photodetector circuit 1b.

Figure 20B:
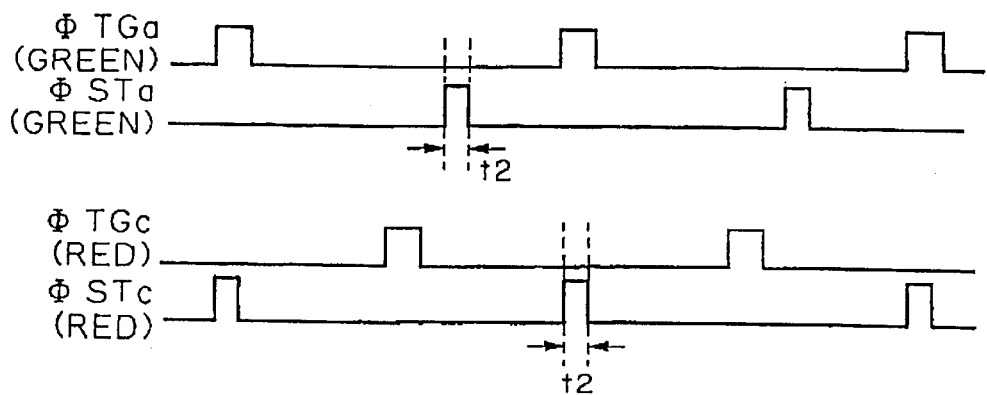
Figure 20C:
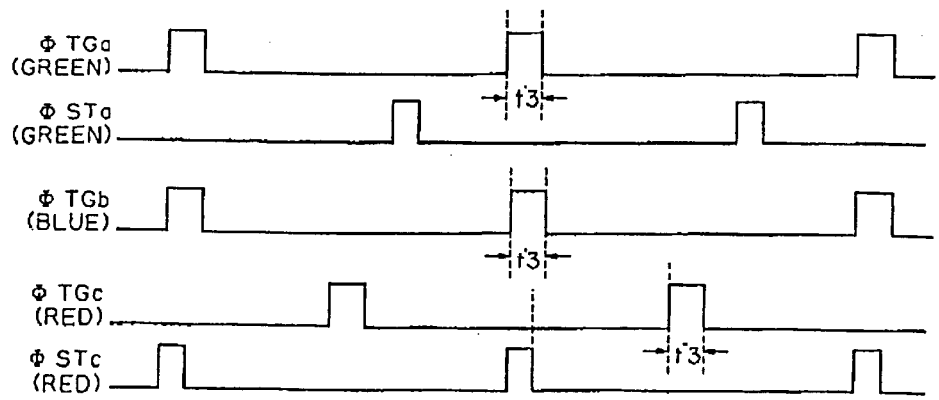

(2) Draining of charges (FIG. 20B):

When the pulses øTGa remain low level and the pulses øSTa are high level in a period t2 shown in FIG. 20B, GREEN charges Qa are drained into the first shutter gate 15a which has a potential VSD, reducing charges in the first photodetector circuit 1a to zero level.

When the pulses øTGc are low level and the pulses øSTc are high level in the period t2 shown in FIG. 20B, RED charges Qb are drained into the second shutter gate 15c which has a potential VSD, reducing charges in the second photodetector circuit 1b to zero level.

When the pulses øTGa, øSTa and the pulses øTGb, øSTc are low level again, charges are stored in the photodetector circuits 1a, 1b. The absence of shutter function at the RED linear image sensor drains no charges therefrom.

(3) Reading of charges (FIG. 20C):

When the pulses øSTa remain low level and the pulses øTGa are high level, GREEN charges Qa are read through the first charge read circuit 2a into the first charge transfer circuit 3a.

Subsequently, the charges Qa are outputted from the first charge transfer circuit 3a through the first signal output circuit 4a in synchronism with the drive clocks ø1, ø2 that are supplied from the first and second pulse lines L1a, L2abc.

When the pulses øSTc are low level and the pulses øTGb, øTGc are high level, BLUE and RED charges Qb, Qc are outputted through the second and third signal output circuits 2b, 2c to the second charge transfer circuit 3bc.

When the pulses øTGb are high level, BLUE charges Qc are read through the third charge read circuit 2c into the second charge transfer circuit 3bc. Thereafter, the charges Qc are outputted from the second charge transfer circuit 3bc through the second signal output circuit 5bc in synchronism with the drive clocks ø1, ø2.

In each of the above embodiments, the linear image sensors of the color linear image sensor device have been described producing GREEN, RED, and BLUE signals. However, the linear image sensors are not limited to those types, and more linear image sensors may be employed.

Although certain preferred embodiments of the present invention have been shown and described in detail, it should be understood that various changes and modifications may be made therein without departing from the scope of the appended claims.

What is claimed is:

1. A color linear image sensor device comprising:
   first, second, and third linear image sensors having different sensitivities with respect to incident light and arranged successively in sensitivity decreasing order from the outermost, and
   a shutter gate and a shutter drain for adjusting an amount of exposure of the linear image sensor which has the highest sensitivity to incident light, wherein,
   only the image sensor with the highest sensitivity to light is provided with a shutter gate and a shutter drain.

2. A color linear image sensor device according to claim 1, further comprising means for changing a pulse interval of a first pulse applied to drain charges stored in the linear image sensor which has the highest sensitivity to incident light and supplied to said shutter gate, through said shutter gate to said shutter drain.

3. A method of manufacturing a color linear image sensor device comprising first, second, and third linear image sensors having different sensitivities with respect to incident light and arranged successively in sensitivity decreasing order from the outermost, and a shutter gate and a shutter drain for adjusting an amount of exposure to the linear image sensor which has the highest sensitivity to incident light, said first, second, and third linear image sensors comprising respective first, second, and third photodetector circuits for converting the incident light into charges, respective first, second, and third charge read circuits for reading the charges generated by said first, second, and third photodetector circuits, respective first, second, and third charge transfer circuits for transferring the charges read by said first, second, and third charge read circuits in synchronism with drive clocks, respective first, second, and third signal output circuits for converting the charges transferred by said first, second, and third charge transfer circuits into voltages, and outputting the voltages, and first through sixth pulse lines for supplying two drive clocks to each of said first, second, and third charge transfer circuits, said method comprising the steps of:
   introducing a P-type impurity into an N-type semiconductor substrate with ion implantation and thermally diffusing the introduced P-type impurity at a high temperature to form a P-type well;
   introducing an N-type impurity into predetermined areas where the first, second, and third photodetector circuits are to be formed with ion implantation, and then thermally diffusing the introduced N-type impurity at a high temperature to form a first N-type region;
   introducing an N-type impurity into predetermined areas where the first, second, and third charge transfer circuits and the shutter drain are to be formed, with ion implantation, and then thermally diffusing the introduced N-type impurity at a high temperature to form second and third N-type regions;
   forming the shutter gate, the first, second, and third charge read circuits, and the first, second, and third charge transfer circuits in predetermined areas, using a thermally oxidized film as an insulating film; and
   introducing a P-type impurity with ion implantation with polycrystalline silicon electrodes used as masks to form a P-type region providing the first, second, and third photodetector circuits in self-alignment with the polycrystalline silicon electrodes.

4. A color linear image sensor device comprising first, second, and third linear image sensors for three colors having different sensitivities with respect to incident light and arranged, successively from the outermost, in order of the linear image sensor whose sensitivity to incident light is the highest, the linear image sensor whose sensitivity to incident light is the lowest, and the linear image sensor whose sensitivity to incident light is middle;
   a first shutter gate and a first shutter drain disposed at the linear image sensor whose sensitivity to incident light is the highest, for adjusting an amount of exposure to said linear image sensor; and
   a second shutter gate and a second shutter drain disposed at the linear image sensor whose sensitivity to incident light is middle, for adjusting an amount of exposure to said linear image sensor,
   wherein only the image sensor with the highest sensitivity to light and only the image sensor whose sensitivity to light is middle are provided with a shutter gate and a shutter drain.

5. A color linear image sensor device according to claim 4,
   wherein said linear image sensor whose sensitivity to incident light is the highest comprises
   a first photodetector circuit for converting the incident light into charges,
   a first charge read circuits for reading the charges generated by said first photodetector circuit,
   a first charge transfer circuit for transferring only the charges read by said first charge read circuits in synchronism with first and second drive clocks,
   a first signal output circuit for converting the charges transferred by said first charge transfer circuit into a voltage, and outputting the voltage, and
   first and second pulse lines for supplying said first and second drive clocks to said first charge transfer circuit, and
   wherein said linear image sensor whose sensitivity to incident light is the lowest and said linear image sensor whose sensitivity to incident light is middle comprise
   respective second and third photodetector circuits for converting the incident light into charges,
   respective second and third charge read circuits for reading the charges generated by said second and third photodetector circuits,
   a second charge transfer circuit for transferring only the charges read by said second and third charge read circuits in synchronism with second and third drive clocks, a second signal output circuit for converting the charges transferred by said second charge transfer circuit into a voltage, and outputting the voltage, and a third pulse line for supplying said third drive clock to said second charge transfer circuit;

said second charge transfer circuit, said signal output circuit, and said first and third pulse lines being shared by only said linear image sensor whose sensitivity to incident light is the lowest and said linear image sensor whose sensitivity to incident light is middle.

6. A color linear image sensor device according to claim 4, further comprising means for changing a pulse interval of a first pulse applied to drain charges stored in the linear image sensor which has the highest sensitivity to incident light and supplied to said first shutter gate, via said first shutter gate to said first shutter drain, and a pulse interval of a second pulse applied to drain charges stored in the linear image sensor which has middle sensitivity to incident light and supplied to said second shutter gate, through said second shutter gate to said second shutter drain.

7. A method of manufacturing a color linear image sensor device comprising first, second, and third linear image sensors for three colors having different sensitivities with respect to incident light and arranged in order of the linear image sensor whose sensitivity to incident light is the highest, the linear image sensor whose sensitivity to incident light is the lowest, and the linear image sensor whose sensitivity to incident light is middle from the outermost, a first shutter gate and a first shutter drain disposed at the linear image sensor whose sensitivity to incident light is the highest, for adjusting an amount of exposure to said linear image sensor, and a second shutter gate and a second shutter drain disposed at the linear image sensor whose sensitivity to incident light is middle, for adjusting an amount of exposure to said linear image sensor, wherein said linear image sensor whose sensitivity to incident light is the highest comprises a first photodetector circuit for converting the incident light into charges, a first charge read circuits for reading the charges generated by said first photodetector circuit, a first charge transfer circuit for transferring the charges read by said first charge read circuit in synchronism with first and second drive clocks, a first signal output circuit for converting the charges transferred by said first charge transfer circuit into a voltage, and outputting the voltage, and first and second pulse lines for supplying said first and second drive clocks to said first charge transfer circuit, and wherein said linear image sensor whose sensitivity to incident light is the lowest and said linear image sensor whose sensitivity to incident light is middle comprise respective second and third photodetector circuits for converting the incident light into charges, respective second and third charge read circuits for reading the charges generated by said second and third photodetector circuits, a second charge transfer circuit for transferring the charges read by said second and third charge read circuits in synchronism with second and third drive clocks, a second signal output circuit for converting the charges transferred by said second charge transfer circuit into a voltage, and outputting the voltage, and a third pulse line for supplying said third drive clock to said second charge transfer circuit, said second charge transfer circuit, said signal output circuit, and said first and third pulse lines being shared by said linear image sensor whose sensitivity to incident light is the lowest and said linear image sensor whose sensitivity to incident light is middle, said method comprising the steps of:

introducing a P-type impurity into an N-type semiconductor substrate with ion implantation and thermally diffusing the introduced P-type impurity at a high temperature to form a P-type well;

introducing an N-type impurity into predetermined areas where the first, second, and third photodetector circuits are to be formed with ion implantation, and then thermally diffusing the introduced N-type impurity at a high temperature to form an N-type region;

introducing an N-type impurity into predetermined areas where the first, second, and third charge transfer circuits and the shutter drains are to be formed, with ion implantation, and then thermally diffusing the introduced N-type impurity at a high temperature to form N-type regions;

forming the shutter gates, the first, second, and third charge read circuit, and the charge transfer circuits in predetermined areas, using a thermally oxidized film as an insulating film; and introducing a P-type impurity with ion implantation with polycrystalline silicon electrodes used as masks to form a P-type region providing the first, second, and third photodetector circuits in self-alignment with the polycrystalline silicon electrodes.

8. The sensor device of claim 1, wherein, each linear image sensor is comprised of a dedicated read out circuit positioned intermediate a dedicated photodetector circuit and a dedicated charge transfer circuit.

9. A color linear image sensor device comprising first, second, and third linear image sensors for three colors having different sensitivities with respect to incident light and arranged, successively from the outermost, in order of the linear image sensor whose sensitivity to incident light is the highest, the linear image sensor whose sensitivity to incident light is the lowest, and the linear image sensor whose sensitivity to incident light is middle;

a first shutter gate and a first shutter drain disposed at the linear image sensor whose sensitivity to incident light is the highest, for adjusting an amount of exposure to said linear image sensor; and a second shutter gate and a second shutter drain disposed at the linear image sensor whose sensitivity to incident light is middle, for adjusting an amount of exposure to said linear image sensor, wherein, the image sensor with the highest light sensitivity comprises a dedicated charge read circuit intermediate a dedicated photodetector circuit and a dedicated charge transfer circuit, and the image sensors with the middle and lowest light sensitivity share a common charge transfer circuit, and comprise a dedicated readout circuit adjacent the common charge transfer circuit and a dedicated photodetector circuit adjacent the corresponding dedicated charge read circuit, the dedicated charge read circuits being intermediate the common charge transfer circuit and the corresponding dedicated photodetector circuits.

* * * * *